United States Patent [19]
Ooishi

[11] Patent Number: 5,412,605
[45] Date of Patent: May 2, 1995

[54] SEMICONDUCTOR MEMORY DEVICE

[75] Inventor: Tsukasa Ooishi, Hyogo, Japan

[73] Assignee: Mitsubishi Denki Kabushiki Kaisha, Tokyo, Japan

[21] Appl. No.: 201,498

[22] Filed: Feb. 24, 1994

[30] Foreign Application Priority Data

Feb. 25, 1993 [JP] Japan ................... 5-036311

[51] Int. Cl.$^6$ ................................. G11C 7/00
[52] U.S. Cl. ................... 365/203; 365/205; 365/208
[58] Field of Search ............. 365/263, 207, 208, 205; 307/530, 296.1, 296.2, 296.6

[56] References Cited

U.S. PATENT DOCUMENTS

| | | | |
|---|---|---|---|
| 5,020,031 | 5/1991 | Miyatake | 365/205 |
| 5,313,426 | 5/1994 | Sakuma et al. | 365/205 |
| 5,325,335 | 6/1994 | Ang et al. | 365/205 |

FOREIGN PATENT DOCUMENTS 2-231760  9/1990  Japan .

OTHER PUBLICATIONS

A Circuit Technology for Sub-10-NS ECL 4-MB BICMOS DRAM'S, Takayuki Kawahara et al., IEEE Journal of Solid-State Circuits, vol. 26, No. 11, Nov. 1991, pp. 1530-1537.
Design of Overdrive Sense Amplifier for High-Speed DRAM, T. Tachibana et al., Nov. 1991, IEEE J. Solid-State Circuits, pp. 5-153.
A Tunable CMOS-DRAM Voltage Limiter with Stabilized Feedback Amplifier, M. Horiguchi et al., pp. 75-76, 1990.

Primary Examiner—Joseph A. Popek
Assistant Examiner—Vu Le
Attorney, Agent, or Firm—Lowe, Price, LeBlanc & Becker

[57] ABSTRACT

A sense amplifier including a pair of NMOS transistors connected in series between a pair of bit lines differential-amplifies the potential difference between the pair of bit lines by reducing the source potentials of the NMOS transistors to ground potential. An NMOS transistor is activated for a predetermined time after initiation of a differential amplification by the sense amplifier, whereby the source potentials of the NMOS transistors are controlled so as to attain a potential lower than the ground potential during that predetermined time. As a result, the operation margin of the NMOS transistors is increased during the predetermined time period.

5 Claims, 17 Drawing Sheets

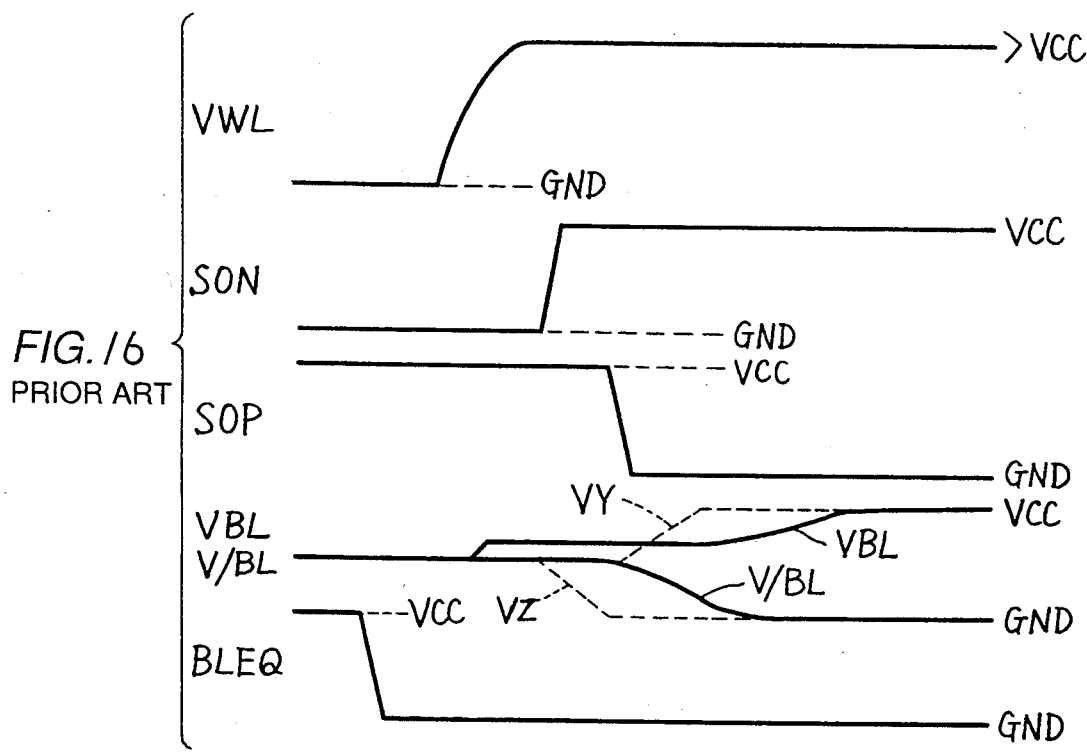
FIG. 16 PRIOR ART
FIG. 17 PRIOR ART
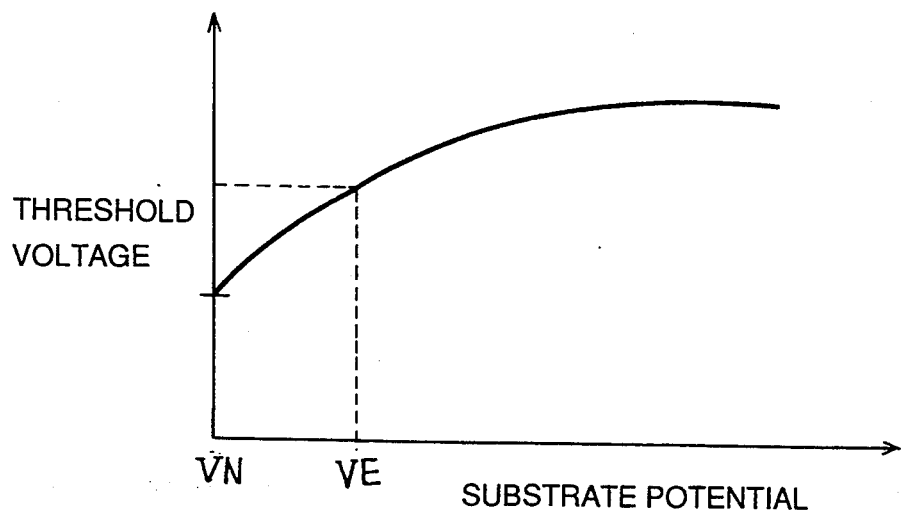

SEMICONDUCTOR MEMORY DEVICE

BACKGROUND OF THE INVENTION

1. Field of the Invention

The present invention relates to a semiconductor memory device, and more particularly, to a portion thereof concerning differential amplify operation.

2. Description of the Background Art

A semiconductor memory device, particularly a dynamic random access memory (referred to as DRAM hereinafter), is provided with a circuit for differential-amplifying the potential difference between a pair of bit lines generated by charge-read out from a memory cell to the bit line pair.

FIG. 15 is a circuit diagram showing a structure of a conventional semiconductor memory device, a DRAM in particular. This semiconductor memory device is formed on a semiconductor substrate 100. A memory cell 1 is connected to one of a pair of bit lines BL and /BL, for example to bit line BL. Memory cell 1 includes a capacitor 1C for storing data and an N channel MOS transistor (NMOS transistor) 1T. NMOS transistor 1T is connected between capacitor 1C and bit line BL. The gate thereof is connected to a word line WL.

Between bit line pair BL and /BL, a first sense amplifier SA1 which is the first differential amplify means, a second sense amplifier SA2 which is the second differential amplify means, and an equalizer EQ which is the precharge means are connected.

First sense amplifier SA1 includes NMOS transistors 4, 5, and 12. NMOS transistors 4 and 5 are connected in series between bit line pair BL, /BL. NMOS transistors 4 and 5 have their sources connected to each other, and their drains connected to bit line BL and bit line /BL, respectively. NMOS transistor 4 has its gate connected to bit line /BL, and NMOS transistor has its gate connected to bit line BL. This connection implements cross coupled NMOS transistors 4 and 5.

NMOS transistor 12 is connected between an outgoing line node Z which is the node between NMOS transistors 4 and 5 and a ground node 11 receiving ground potential GND. The gate of NMOS transistor 12 is applied with a sense operation activating signal SON.

Second sense amplifier SA2 includes P channel MOS transistors (referred to as PMOS transistor hereinafter) 6, 7 and 14. PMOS transistors 6 and 7 are connected in series between bit line pair BL and /BL. PMOS transistors 6 and 7 have their sources connected to each other, and their drains connected to bit line BL and bit line /BL, respectively. PMOS transistors 6 and 7 have their gates connected to bit lines /BL and BL, respectively. Such a connection implements cross coupled PMOS transistor 6 and 7.

A PMOS transistor 14 is connected between a supply line node Y which is the node between PMOS transistors 6 and 7 and a power supply node 13 receiving power supply potential VCC. The gate of PMOS transistor 14 is applied with a sense operation activating signal SOP.

Equalizer EQ includes NMOS transistors 8, 9 and 10. NMOS transistor 8 is connected between the pair of bit lines BL and /BL. NMOS transistor 9 is connected between bit line BL and a potential node Vpr receiving a potential of ½ the power supply potential VCC. NMOS transistor 10 is connected between bit line /BL and potential node Vpr. Each gate of NMOS transistors 8, 9 and 10 is applied with a precharge activating signal BLEQ.

An NMOS transistor 15 is connected between outgoing line node Z and potential node Vpr. An NMOS transistor 16 is connected between supply line node Y and potential node Vpr. Each gate of NMOS transistors 15 and 16 is applied with a precharge activating signal BLEQ.

On bit line pair BL and /BL, NMOS transistors 2 and 3 for connecting first and second sense amplifiers SA1 and SA2 and equalizer EQ with memory cell 1 are provided between memory cell 1, and first and second sense amplifiers SA1, SA2 and equalizer Q. NMOS transistor 2 is provided at bit line BL and NMOS transistor 3 is provided at bit line /BL. NMOS transistors 2 and 3 are activated by activating signal BLI.

The operation of a semiconductor memory device of the above-described structure is described hereinafter. In a standby state (precharge state) of this device, bit line pair BL, /BL, outgoing line node Z, and supply line node Y are precharged to a potential of ½ VCC (referred to as precharge potential hereinafter).

Precharge is effected by precharge activating signal BLEQ attaining a high level to activate NMOS transistors 8, 9, 10, 15 and 16. More specifically, precharge is carried out by respective short-circuits between bit line pair BL, /BL and potential node Vpr, between outgoing line node z and potential node Vpr, and between supply line node Y and potential node Vpr.

A data read-out operation from memory cell 1 is described hereinafter. In a read out operation, data is transmitted from memory cell 1 to bit line BL, followed by an amplify operation by first and second sense amplifiers.

FIG. 16 is a signal waveform diagram of each component in circuitry at the time of a read out operation. Read out operation will be described with reference to FIG. 12.

When stabilization of the above-described precharge state is achieved, precharge activating signal BLEQ is pulled down to a low level, whereby NMOS transistors 8, 9, 10 and 11 are inactivated. As a result, the pair of bit lines BL, /BL attain a floating status at precharge potential.

When word line WL is activated to have potential VBL raised, charge representing data stored in memory cell 1 is transmitted on bit line BL. This is the transmission operation of data. If memory cell 1 stores data "1", for example, potential VBL of bit line BL becomes slightly higher than the precharge potential. Bit line /BL remains at the precharge potential. Therefore, there is a slight potential difference between bit lines BL and /BL.

When such a potential difference is generated, this potential difference is amplified by the amplify operation of first and second sense amplifiers SA1 and SA2. In the amplify operation, first an amplification by the first amplifier SA1 is carried out. Sense operation activating signal SON is activated to attain a high level, whereby NMOS transistor 12 is activated. This causes shorting between outgoing line node Z and ground node 11, whereby potential VZ of outgoing line node Z is decreased towards ground potential GND.

As a result, NMOS transistors 4 and 5 have their gate-source voltages increased to be activated. When NMOS transistors 4 and 5 are activated, the on resistance of NMOS transistor 5 becomes lower than that of NMOS transistor 4 due to potential VBL of bit line BL being higher than potential V/BL of bit line /BL, whereby potential V/BL of bit line /BL is reduced.

Next, amplification by second sense amplifier SA2 is carried out. Sense operation activation signal SOP is activated to attain a low level, whereby PMOS transistor 14 is activated. This causes shorting between supply line node Y and power supply node 13, whereby potential VY of supply line node Y is increased towards power supply potential Vcc.

As a result, PMOS transistors 6 and 7 have their gate-source voltages increased to be activated. When PMOS transistors 6 and 7 are activated, the on resistance of PMOS transistor 6 becomes smaller than that of PMOS transistor 7 due to potential V/BL of bit line /BL being lower than potential VBL of bit lines BL. Therefore potential VBL of bit line BL increases.

Then, potential V/BL of bit line /BL is reduced to the level of ground potential GND, and potential VBL of bit line BL is increased to the level of power supply potential VCC. By the above-described amplify operation, a slight potential difference between bit lines BL and /BL is amplified to a greater level.

At the start of an amplify operation, the source potentials of NMOS transistors 4 and 6 attain a precharge potential, as described above. The substrate potential is generally ground potential GND or lower thereof, i.e. a potential lower than the source potential. Therefore, NMOS transistors 4 and 6 are subjected to a body effect at the start of an amplify operation, whereby each threshold voltage becomes higher than the case where the threshold value of a transistor has equal substrate potential and source potential.

The reason thereof is set forth in the following. FIG. 17 is a graph showing the relationship between a substrate potential and a threshold voltage by a solid line. The threshold voltage is plotted along the ordinate, and the substrate potential is plotted along the abscissa (the potential decreases in the right direction).

It is apparent from FIG. 17 that the threshold voltage increases according to a reduction of the substrate potential with respect to the source potential. For example, the threshold voltage at a substrate potential of VN which is a potential where the source potential equals the substrate potential is lower than the threshold voltage at a substrate potential of VE which is a potential where the substrate potential is lower than the source potential, as indicated by the broken line in the graph.

Although the graph of FIG. 17 relates to an NMOS transistor, the same holds for a PMOS transistor provided that the polarity of the potential between the source potential and the substrate potential differs.

When the absolute value of a threshold voltage of a MOS transistor increases due to a body effect, a problem occurs as set forth in the following.

In response to the demand of reducing the size of a semiconductor memory device, a trend is towards lowering the power supply potential of the device. In response to such a reduction in power supply potential, the precharge potential which is ½ the power supply potential is also reduced. When the absolute value of a threshold voltage in a MOS transistor of a sense amplifier is increased due to a body effect in the case where precharge potential is reduced, the difference between the precharge potential and the threshold voltage becomes smaller. This reduction in the difference between a precharge potential and a threshold voltage results in problems such as reduction in the sense operation speed of a sense amplifier or the sense amplifier not operating.

Because a MOS transistor is also used in an equalizer as well as in a sense amplifier in a semiconductor memory device, reduction in the power supply potential will lead to the possibility of malfunction in the equalizer by reasons identical to those of a sense amplifier. A predetermined precharge potential level cannot be achieved if malfunction occurs in an equalizer, and margin of the sense operation of a sense amplifier is reduced. This margin reduction results in a problem that the speed of sense operation is reduced or that the sense amplifier is not operated.

In addition to the above-described problems caused by a body effect, reduction of a power supply potential causes problems as set forth in the following.

FIGS. 18(A) and 18(B) are graphs showing the relationship between a gate-source voltage of a general MOS transistor and current flowing therein. Logarithm of current is plotted along the ordinate, and the gate-source voltage is plotted along the abscissa. In the graphs, the gate-source voltage applying a current of a predetermined value (in this embodiment, $10^{-6}$A) to the MOS transistor represents threshold voltage.

The relationship between a gate-source voltage and a current in a MOS transistor generally has the characteristics shown in FIG. 18(A). More specifically, in a region of the gate-source voltage that is below the threshold voltage (referred to as sub-threshold region hereinafter), the current increases according to increase in the gate-source voltage. If the gate-source voltage exceeds the threshold voltage, the current is saturated at a predetermined value. If the aforementioned body effect works greatly, current will not easily flow in the MOS transistor, whereby the characteristics vary in the direction indicated by the arrow. As a result, the gate-source voltage increases at a current value corresponding to the threshold voltage to cause increase in the threshold voltage.

In a MOS transistor having the characteristics shown in FIG. 18(A), the gradient of the characteristic curve in the sub-threshold region become more gentle when voltage is applied to the drain as shown in FIG. 18(B) in proportion to reduction in the threshold voltage. This reduction in the inclination of the characteristic curve results in a greater current value when the gate-source voltage is 0 V. Increase in a current value means that the leak current in a MOS transistor is increased.

Thus, because leak current increases as the threshold voltage is reduced in a MOS transistor, a semiconductor memory device having power supply potential reduced and set with a lower value of threshold voltage will encounter increase in leak current in the MOS transistor of a sense amplifier. This leads to a problem that the potential of a bit line after amplification by a sense amplifier is deviated from a predetermined stable value in a semiconductor memory device.

As described above, a conventional semiconductor memory device had a problem that stabilization of operation cannot be achieved due to reduction in the power supply potential. A semiconductor memory device solving such a problem is disclosed in Japanese Patent Laying-Open No. 2-231760. This semiconductor memory device has the well potential of a MOS transistor forming a sense amplifier varied according to a change in the source potential of that MOS transistor. The body effect is suppressed by varying the well potential of a MOS transistor according to a change in the source potential, whereby the operation of the sense amplifier is stabilized.

However, the semiconductor memory device disclosed in Japanese Patent Laying-Open No. 2-231760 had problems set forth in the following. Although this semiconductor memory device can have a body effect of a MOS transistor forming a sense amplifier suppressed, reduction in the operation speed of a sense operation could not be compensated for when the power supply potential of a semiconductor memory device is reduced significantly and the difference between the precharge potential and the threshold voltage of a MOS transistor is reduced significantly.

This semiconductor memory device can achieve stabilization of the operation of a sense amplifier, but does not solve unstabilization of the operation of an equalizer in accordance with reduction in the power supply potential.

Furthermore, although such a semiconductor memory device can achieve stabilization in the operation of a sense amplifier at the start of a sense operation, it cannot solve unstabilization of the potential of a bit line pair after amplification by a sense amplifier.

Since a semiconductor memory device disclosed in Japanese Patent Laying-Open No. 2-231760 also had various problems as described above, there is still the problem of unstabilization of operation according to reduction of the power supply potential not sufficiently prevented in a conventional semiconductor memory device.

SUMMARY OF THE INVENTION

An object of the present invention is to allow stable operation of a sufficient level even when the power supply potential is reduced in a semiconductor memory device including a sense amplifier.

Another object of the present invention is to allow stable operation of a sufficient level when the power supply potential is reduced in a semiconductor memory device including a sense amplifier and an equalizer.

Another object of the present invention is to suppress leak current in a MOS transistor in a sense amplifier.

A semiconductor memory device according to the present invention includes a memory cell, a pair of bit lines, a differential amplify circuit, and a potential control circuit.

The memory cell has charge representing data stored. The pair of bit lines are connected to the memory cell. A potential difference therebetween according to charge is generated.

The differential amplify circuit includes a pair of MOS transistors connected in series between the pair of bit lines. By decreasing the potential of the sources of the MOS transistors to a first potential, the potential difference between the pair of bit lines is differential-amplified.

The potential control circuit controls the source potentials of the MOS transistors so as to attain a second potential lower than the first potential for a predetermined time period at the start of a differential-amplify operation by the differential amplify circuit.

Because the source potentials of the MOS transistors are set to a second potential lower than the first potential of normal operation for a predetermined time period at the start of a differential-amplify operation in the differential amplify circuit, the operation margin of the MOS transistor at the start of a differential-amplify operation is improved. Therefore, the differential amplify circuit operates reliably regardless of a body effect to carry out a differential-amplify operation at high speed, so that stable operation at high speed can be carried out even in the case where power supply potential is reduced.

According to another aspect of the present invention, a semiconductor device includes a memory cell, a pair of bit lines, a differential amplify circuit, and a potential control circuit.

The memory cell has charge representing data stored. The pair of bit lines are connected to the memory cell. A potential difference therebetween according to charge is generated.

The differential amplify circuit includes a pair of MOS transistors connected in series between the pair of bit lines. By increasing the potentials of the sources of the MOS transistors to a first potential, the potential difference between the bit line pair is differential-amplified.

The potential control circuit controls the source potentials of the MOS transistors so as to attain a second potential higher than the first potential for a predetermined time period at the start of a differential-amplify operation by the differential amplify circuit.

Because the source potentials of the MOS transistors are set to a second potential higher than the first potential of normal operation for a predetermined time period at the start of a differential-amplify operation in the differential amplify circuit, the operation margin of the MOS transistor at the start of a differential-amplify operation is improved. Therefore, the differential amplify circuit operates reliably regardless of a body effect to carry out a differential-amplify operation at high speed, so that stable operation at high speed can be carried out even when power supply potential is reduced.

According to a further aspect of the present invention, a semiconductor memory device formed on a semiconductor substrate includes a memory cell, a pair of bit lines, a precharge circuit, a differential amplify circuit, and a potential control circuit.

The memory cell is stored with charge representing data. The pair of bit lines are connected to the memory cell. Potential difference therebetween is generated according to charge.

The precharge circuit includes a MOS transistor connected between the pair of bit lines. By operation of that MOS transistor, the pair of bit lines are precharged to a predetermined precharge potential prior to generation of a potential difference.

The differential amplify circuit includes a pair of MOS transistors connected in series between the bit lines. The potentials of the sources of the MOS transistors are set to the precharge potential in the precharge operation. Then, the potential difference between the bit line pair is differential-amplified by a change from the precharge potential.

The potential control circuit controls the substrate potential of the MOS transistor of the precharge circuit in accordance with a change of the source potentials of the MOS transistors of the differential amplify circuit.

In the precharge circuit, the substrate potential of the MOS transistor is varied according to the source potential of the MOS transistors of the differential amplify circuit in a precharge operation. Therefore, in the MOS transistor of the precharge circuit, the difference between the source potential and the substrate potential becomes smaller to reduce the body effect. Even if power supply potential is reduced, the MOS transistor of the precharge circuit operates reliably to carry out precharging at high speed. As a result, the differential amplify circuit can carry out stable operation at high speed even when power supply potential is reduced.

According to still another aspect of the present invention, a semiconductor memory device formed on a semiconductor substrate includes a memory cell, a pair of bit lines, a first differential amplify circuit, a second differential amplify circuit, a first potential control circuit, and a second potential control circuit.

The memory cell has charge representing data stored. The pair of bit lines are connected to the memory cell. A potential difference therebetween according to charge is generated.

The first differential amplify circuit includes a pair of MOS transistors connected in series between the pair of bit lines. The potential difference between the bit lines is differential-amplified by lowering the potential of the sources of the MOS transistors. The bit line having a lower potential of the bit line pair is reduced to a first level of potential.

The second differential amplify circuit includes a pair of MOS transistors connected in series between the pair of bit lines. The potential difference between the bit lines is differential-amplified by increasing the source potential of the MOS transistors. The bit line having a higher potential of the bit line pair is increased to a second level of potential.

The first potential control means carries out control so that the substrate potentials of the MOS transistors of the first differential amplify circuit attain a third potential lower than the first level of potential after the bit line having the lower potential of the bit line pair is brought to the first level of potential by the first differential amplify circuit.

The second potential control means carries out control so that the substrate potentials of the MOS transistors of the second differential amplify circuit attain a fourth potential higher than the second level of potential after the bit line having the higher potential of the bit line pair is brought to the second level of potential by the second differential amplify circuit.

In the first differential amplify circuit, the substrate potentials of the MOS transistors become lower than the source potential after the potentials of the bit lines are stabilized by the differential amplify operation. In the second differential amplify circuit, the substrate potentials of the MOS transistors become lower than the source potential after stabilization of the potentials of the bit lines by a differential amplify operation.

The respective potentials of each bit line attaining the first level of potential and the second level of potential implies that the differential amplification by the first and second differential amplify circuits is completed. Then, the substrate potentials of the MOS transistors of the first differential amplify circuit become lower than the first level of potential i.e. lower than the source potential by the first potential control circuit. Therefore, a body effect works on the MOS transistors to increase the threshold voltages thereof. Similarly, the substrate potentials of the MOS transistors of the second differential amplify circuit become higher than the second level of potential, i.e. higher than the source potential by the second potential control circuit. Therefore, a body effect works on the MOS transistors to increase the threshold voltages thereof.

After stabilization of the potentials of bit lines following a differential amplification, a body effect occurs in the respective MOS transistors in the first and second differential amplify circuits, whereby the threshold voltages are increased to decrease leak current. Thus, the potentials of the bit lines are stabilized after differential amplification to allow stable operation of the device even when power supply potential is reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 is a signal waveform diagram of each component in circuitry at the time of a read out operation by a conventional semiconductor memory device.

FIG. 17 is a graph showing the relationship between a substrate potential and a threshold voltage in a transistor.

DESCRIPTION OF THE PREFERRED EMBODIMENTS

Embodiments of the present invention will be described hereinafter with reference to the drawings.

First Embodiment

Figure 1:
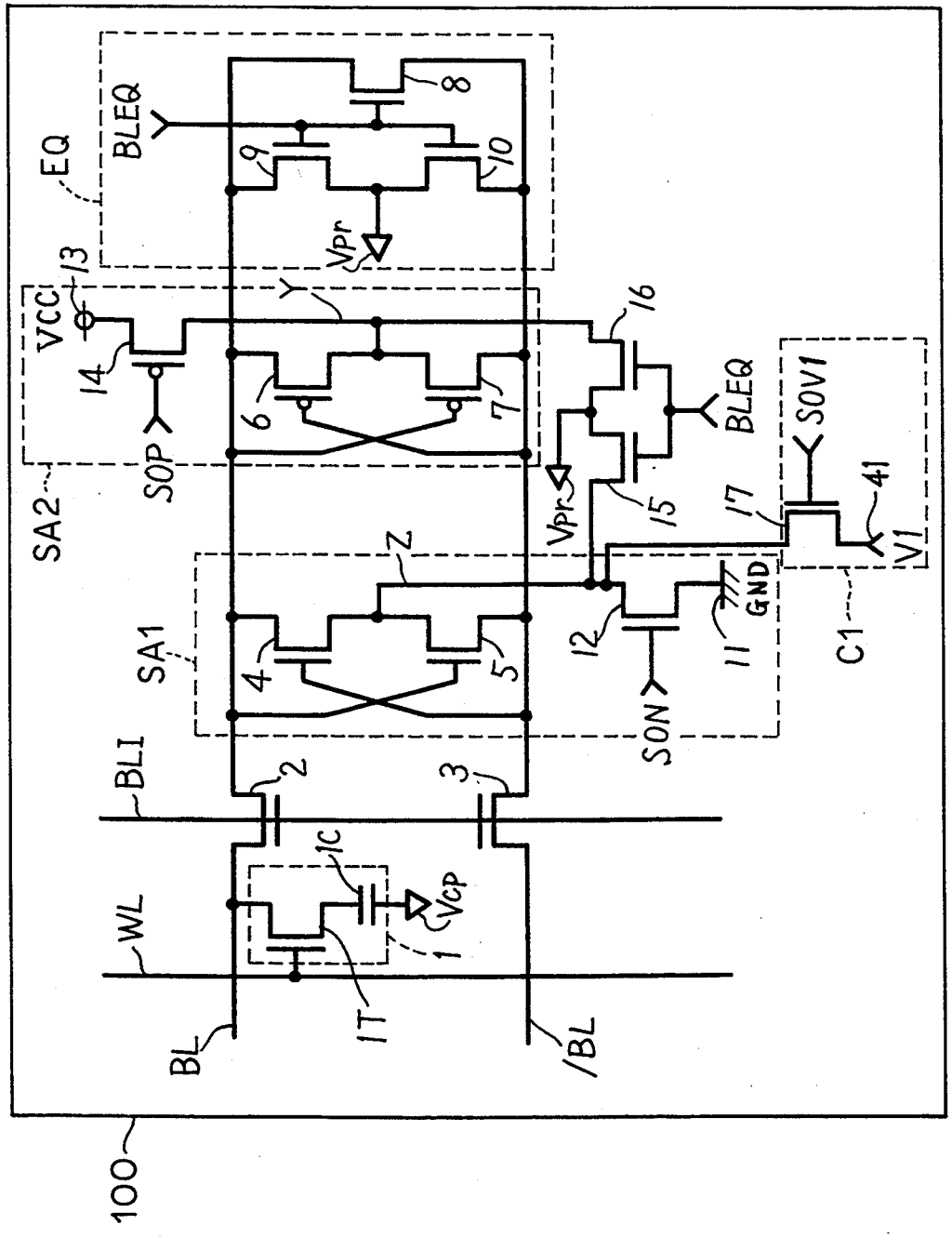
FIG. 1 is a circuit diagram showing a structure of a semiconductor memory device according to a first embodiment of the present invention.
Figure 2:
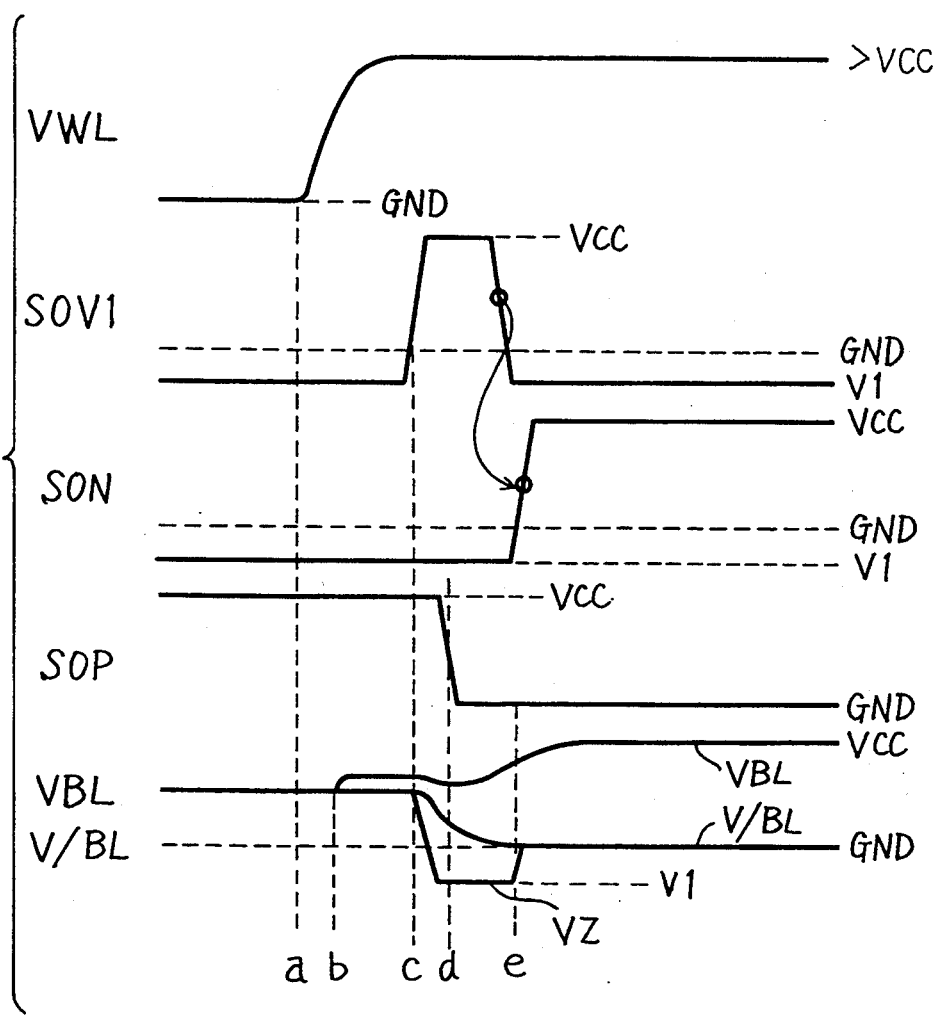
FIG. 2 is a signal waveform diagram of each component in circuitry in data read out operation in the semiconductor memory device of the first embodiment.

FIG. 1 is a circuit diagram showing a structure of a semiconductor memory device according to a first embodiment of the present invention.

Figure 15:
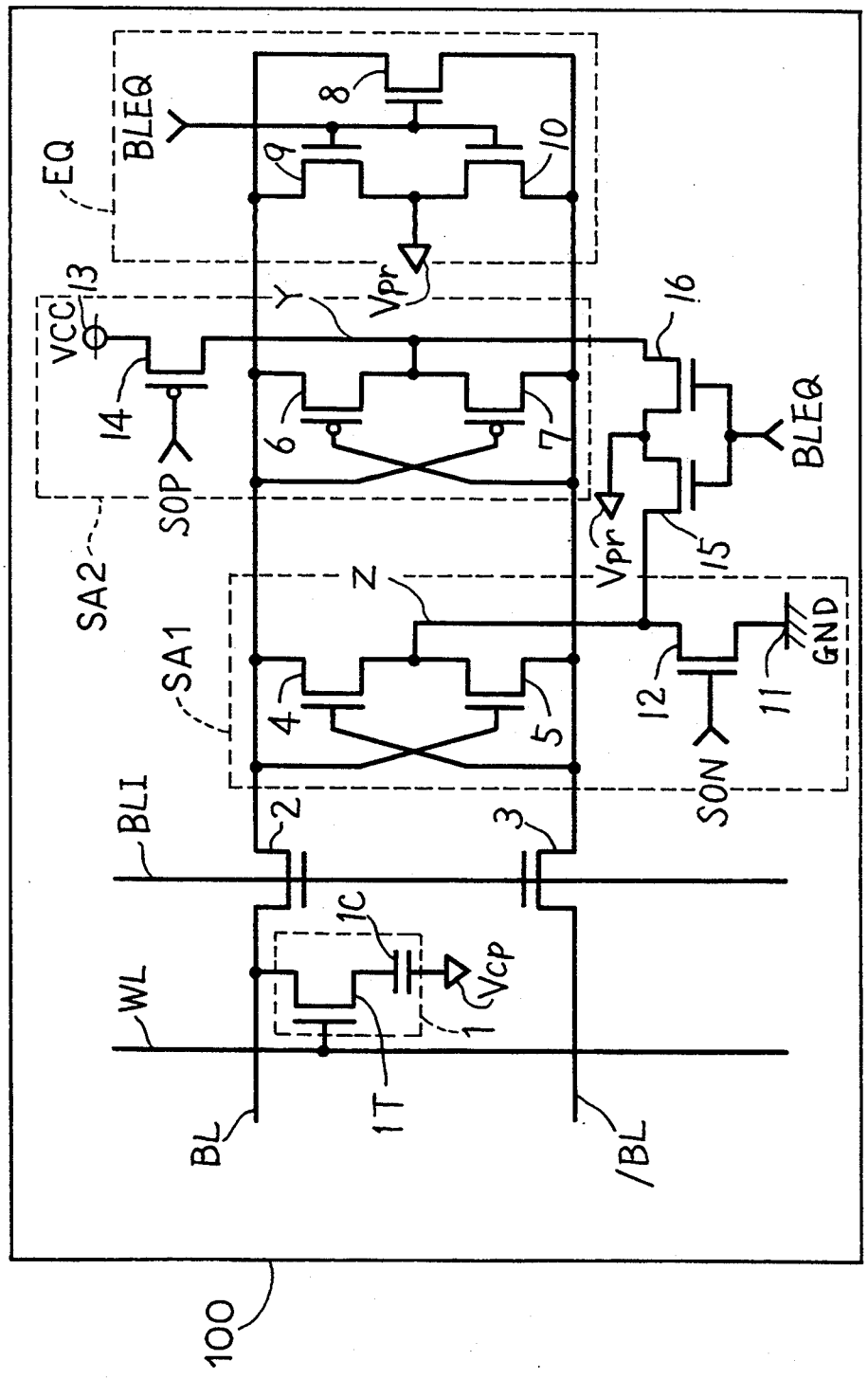
FIG. 15 is a circuit diagram showing a structure of a conventional semiconductor memory device.
Figure 18A:
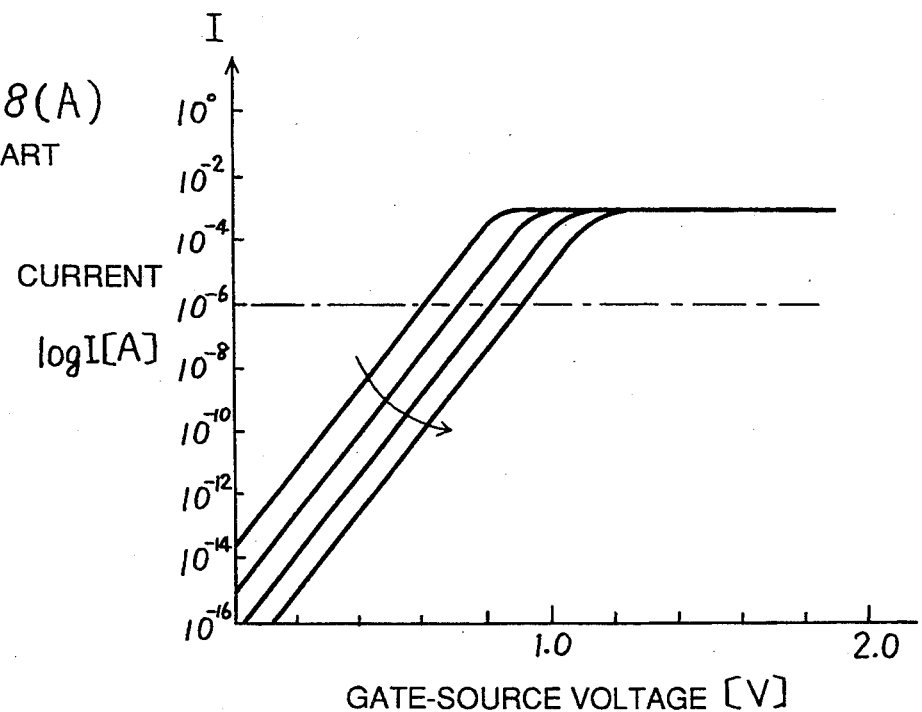
FIGS. 18(A) and 18(B) are graphs showing the relationship between the gate-source voltage and current of a transistor.
Figure 18B:
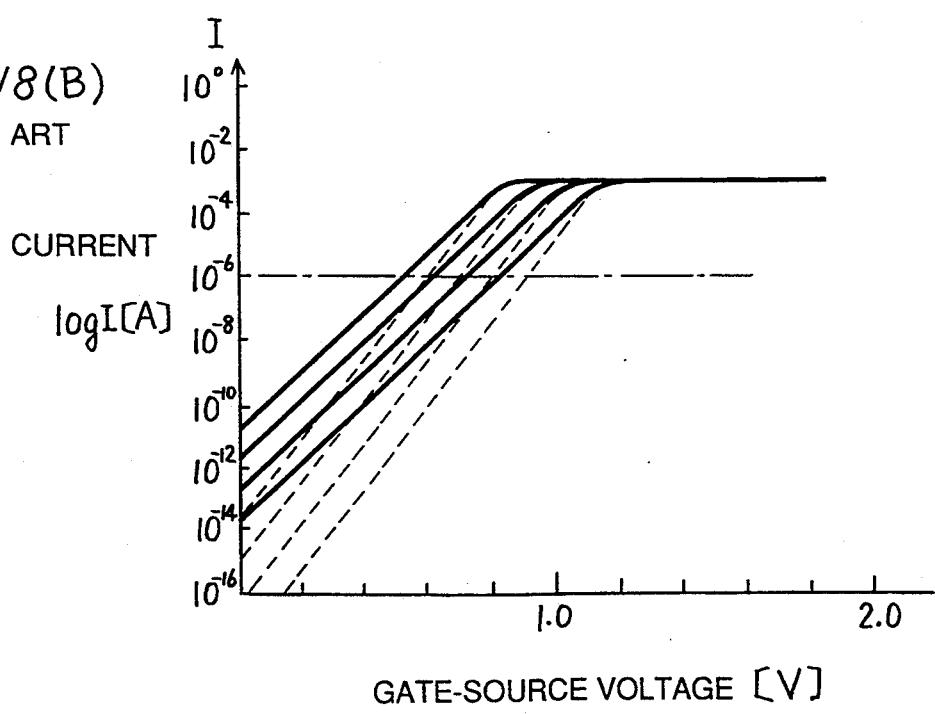

Because the basic structure of the semiconductor memory device of FIG. 1 is similar to that of FIG. 15, corresponding elements have the same reference character denoted, and description thereof will not be repeated.

Referring to FIG. 1, a semiconductor memory device includes a potential control circuit C1. Potential control circuit C1 includes a potential node 41 and an NMOS transistor 17. NMOS transistor 17 is connected between potential node 41 receiving a potential V1 lower than ground potential GND and an outgoing line node Z. A control signal SOV1 is applied to the gate of NMOS transistor 17. NMOS transistor 17 serves to lower the source potentials of NMOS transistors 4 and 5 to a level lower than ground potential GND. The semiconductor memory device of FIG. 1 is similar to the semiconductor memory device of FIG. 15 except for the portion where NMOS transistor 17 is provided. The amplitudes of control signal SOV1 and a sense operation activating signal SON are set to that between power supply potential VCC and potential V1 to prevent unnecessary leak current.

The operation of the semiconductor memory device of FIG. 1 will be described hereinafter. FIG. 1 is a signal waveform diagram of each component in circuitry at the time of data read out according to the semiconductor memory device of the first embodiment.

At time a, word line WL is activated. As a result, charge is transmitted from memory cell 1 to bit line BL to cause a potential difference in the pair of bit lines BL, /BL at time b.

At time c, control signal SOV1 is activated to attain a high level, whereby NMOS transistor 17 is activated. Activation of NMOS transistor 17 results in short circuit between outgoing line node Z and potential node 31, whereby potential VZ of outgoing line node Z is reduced towards a first potential V1. Therefore, NMOS transistors 4 and 5 have their gate-source voltages increased to be activated.

When NMOS transistors 4 and 5 are activated, the on resistance of NMOS transistor 5 becomes lower than that of NMOS transistor 4 due to potential VBL of bit line BL being higher than potential V/BL of bit line /BL. Therefore, potential V/BL of bit line /BL is reduced. Because the gate-source voltages of NMOS transistors 4 and 5 are very high, potential V/BL of bit line /BL is reduced at high speed.

At time d, sense operation activating signal SOP is activated to attain a low level, whereby PMOS transistors 6 and 7 are activated. Potential VZ of outgoing line node Z attaining a first potential V1 is maintained for a predetermined time. When PMOS transistors 6 and 7 are activated, the on resistance of PMOS transistor 6 is lower than that of PMOS transistor 7 due to potential V/BL of bit line /BL being lower than potential VBL of bit line BL, whereby potential VBL of bit line BL is increased.

Because it is not necessary to set the potential of outgoing line node Z to potential V1 to increase the operation speed of differential amplification if there is a sufficient potential difference between the pair of bit lines BL and /BL, control signal SOV1 is inactivated. At time e, sense operation activating signal SON is activated to attain a high level, whereby NMOS transistor 12 is activated. Activation of NMOS transistor 12 causes short circuit between outgoing line node Z and ground node 11, whereby potential VZ of outgoing line node Z is controlled so as to attain ground potential GND.

In the semiconductor memory device according to the first embodiment carrying out the above-described operation, potential VZ of outgoing line node Z is controlled to attain potential V1 lower than ground potential GND for a predetermined time after initiation of an amplify operation of first sense amplifier SA1. Therefore, at the beginning of an amplify operation, the gate-source voltages of NMOS transistors 4 and 5 become higher to increase the operation margin thereof.

As a result, NMOS transistors 4 and 5 can operate reliably to carry out differential amplification at high speed on the basis of a very high original operation margin even when the precharge potential is lowered due to reduction of power supply potential or when the threshold voltage is increased due to a body effect occurring on NMOS transistors 4 and 5.

Figure 3:
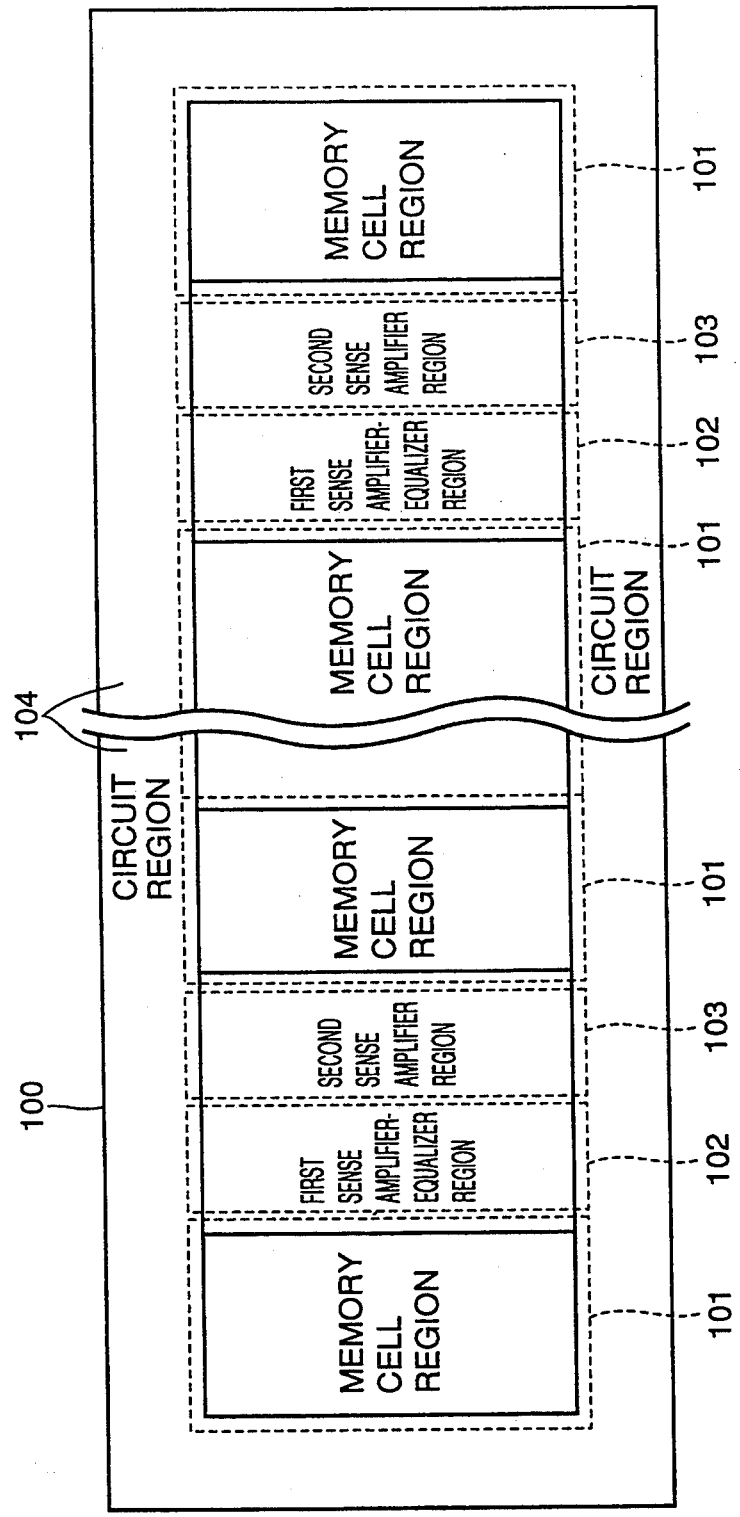
FIG. 3 is a plan view schematically showing the entire structure of a semiconductor substrate having a semiconductor memory device formed.

The above-described semiconductor memory device is formed on a semiconductor substrate. FIG. 3 is a plan view schematically showing the entire structure of a semiconductor substrate having the above-described semiconductor memory device formed.

The well of the array portion of semiconductor substrate 100 in which a semiconductor memory device is formed includes memory cell regions 101, first sense amplifier-equalizer regions 102, and second sense amplifier regions 103.

Memory cell region 101 has a memory cell 1 formed, and is a P type well region isolated from other regions such as a peripheral circuit region 104. First sense amplifier-equalizer region 102 has a first sense amplifier SA1 and an equalizer EQ formed, and is a P type well region isolated from other regions similar to memory cell region 101. Second sense amplifier region 103 has a second sense amplifier SA2 formed, and is an N type well region isolated from other regions similar to memory cell regions 101 and first sense amplifier-equalizer region 102.

Because the well of each region of memory cell region 101, first sense amplifier-equalizer 102, and second sense amplifier region 103 is isolated from other well regions adjacent thereto, a change in the well potential of one region will not effect the operation of a MOS transistor provided in another well region.

Figure 4:
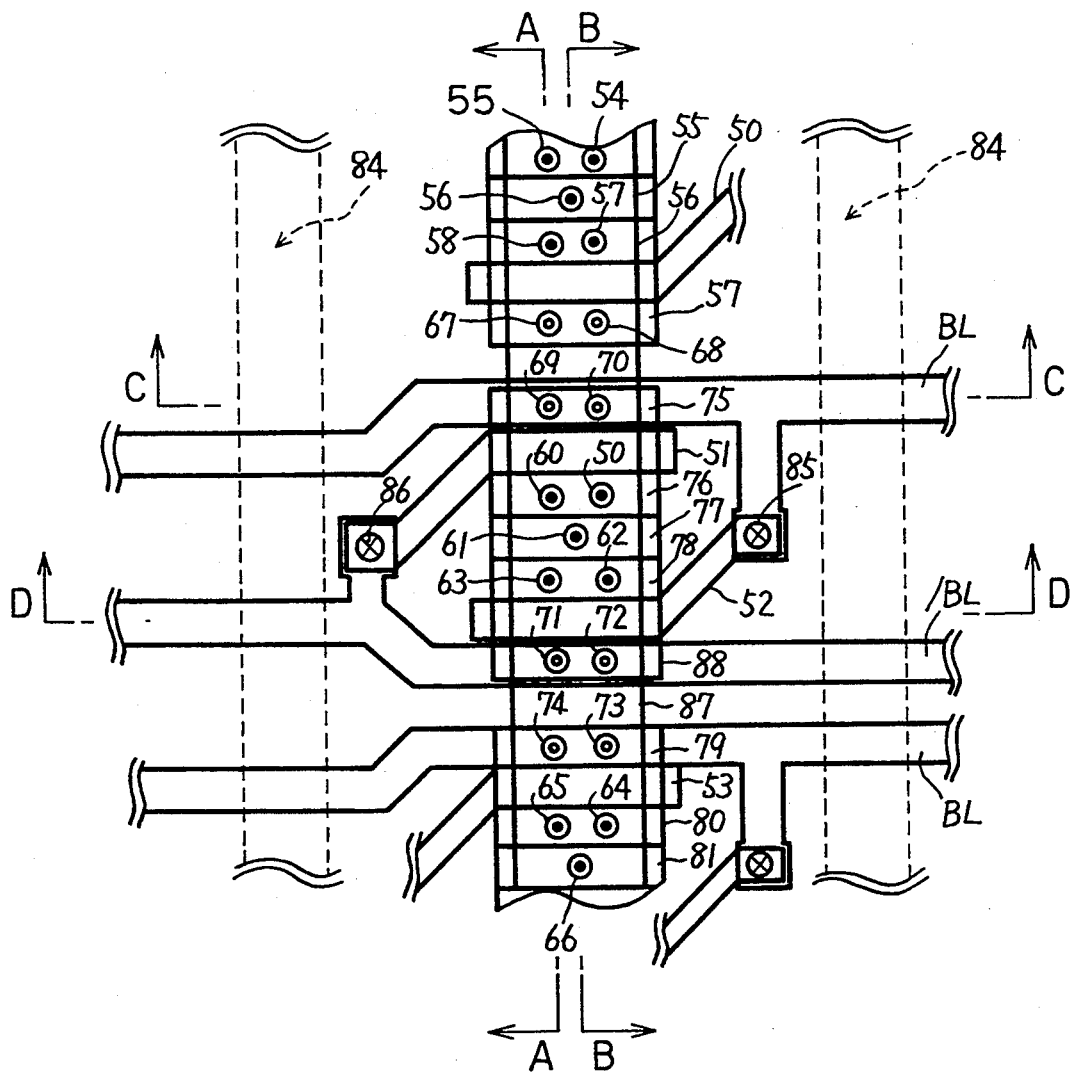
FIG. 4 is a plan view schematically showing an example of the layout of the portion of a first sense amplifier.

FIG. 4 is a plan view schematically showing a layout of a first sense amplifier portion formed by NMOS transistors such as NMOS transistors 4 and 5. Gate electrodes 50, 51, 52 and 53 are respectively formed of a first interconnection layer, and are connected to a pair of bit lines BL and /BL. Specifically, gate electrode 51 is connected to bit line /BL via a contact 86, and gate electrode 52 is connected to bit line BL via a contact 85.

The pair of bit lines BL and /BL are formed of a second interconnection layer. Bit line BL is connected to an N type high concentration layer 75 which becomes the drain of an NMOS transistor via contacts 69 and 70. Bit line /BL is connected to an N type high concentration layer 88 which becomes the drain of an NMOS transistor via contacts 71 and 72.

N type high concentration layers 76 and 78 which become the sources of NMOS transistors are connected to a third interconnection layer 87 via contacts 59, 60, 62 and 63. A P type high concentration layer 77 for applying potential to a P type well is also connected to third interconnection layer 87 via contact 61. The portion forming such an NMOS transistor is surrounded by an N type layer 84.

The layout is not limited to the structure in which N type high concentration layers 76 and 78 are in contact with P type high concentration layer 77, and the high concentration layers may be arranged spaced apart. It is to be noted that the present embodiment will not define the structure of an NMOS transistor. Such a layout is only by way of example, and other arrangements may be used as long as the structure is electrically similar to that shown in FIG. 4.

FIGS. 5(A)-5(D) are sectional views of various portions of FIG. 4, taken along line A—A, line B—B, line C—C, and line D—D, respectively.

Figure 5:
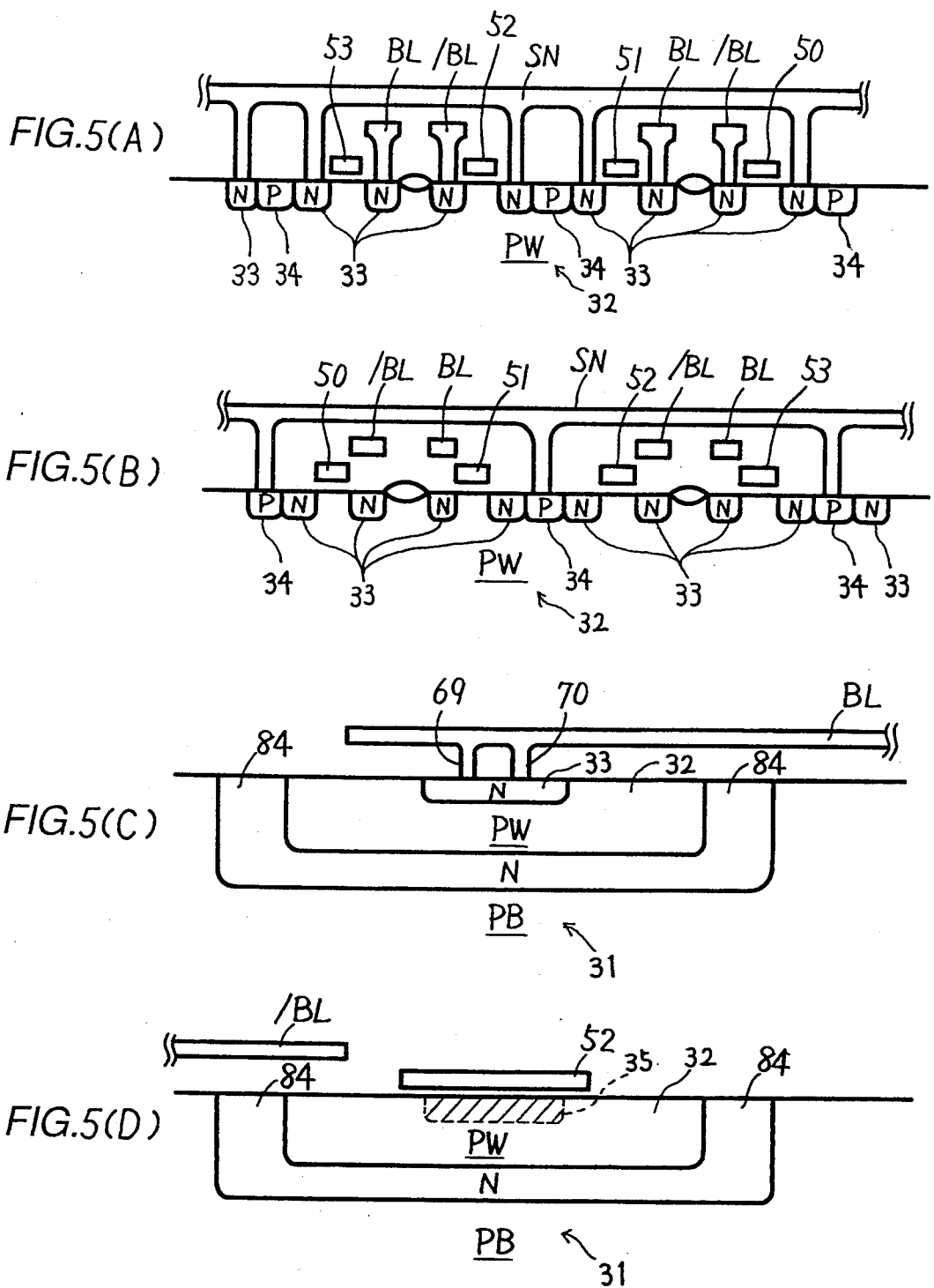
FIG. 5(A) is a schematic sectional view taken along line A—A of FIG. 4.
FIG. 5(B) is a schematic sectional view taken along line B—B of FIG. 4.
FIG. 5(C) is a schematic sectional view taken along line C—C of FIG. 4.
FIG. 5(D) is a schematic sectional view taken along line D—D of FIG. 4.

Referring to FIG. 5(C), an N type layer 84 is formed in P type substrate 31, and a P type well 32 is formed in N type layer 84. P type well 32 is electrically isolated from P type substrate 31 by N type layer 84.

N type high concentration layers 33 and P type high concentration layers 34 are formed with appropriate distance therebetween at the main surface of P type well 32, as shown in FIGS. 5(A) and 5(B). Outgoing line node Z is formed on P type well 32, N type high concentration layer 32, and P type high contraction layer 34 with an interlayer insulating film therebetween. Outgoing line node Z is connected to N type and P type high concentration layers 33 and 34.

Bit line pair BL, /BL and gate electrodes 50, 51, 52 and 53 are formed between outgoing line node Z, and P type well 32, N type high concentration layer 33 and P type high concentration layer 34, as shown in FIGS. 5(A), 5(B) and 5(D). Bit lines BL and /BL are connected to N type high concentration layer 34.

When potential is applied to gate electrode 52, a channel 35 is formed at the main surface of P type well 32 as shown in FIG. 5(D).

In accordance with the above-described structure, the region of P type well 32 including NMOS transistors 4 and 5 of first sense amplifier SA1 is isolated from other wells at the periphery thereof. Similarly, the well region in which NMOS transistor 6 and 7 are located in second sense amplifier SA2 is isolated from other wells located at the periphery thereof provided that the polarity is opposite to that of first sense amplifier SA1.

Second Embodiment

A second embodiment of the present invention will be described hereinafter with reference to FIG. 6. Because the basic structure of the semiconductor memory device in FIG. 6 is similar to that of FIG. 15, corresponding elements have the same reference character denoted, and their description will not be repeated.

Figure 6:
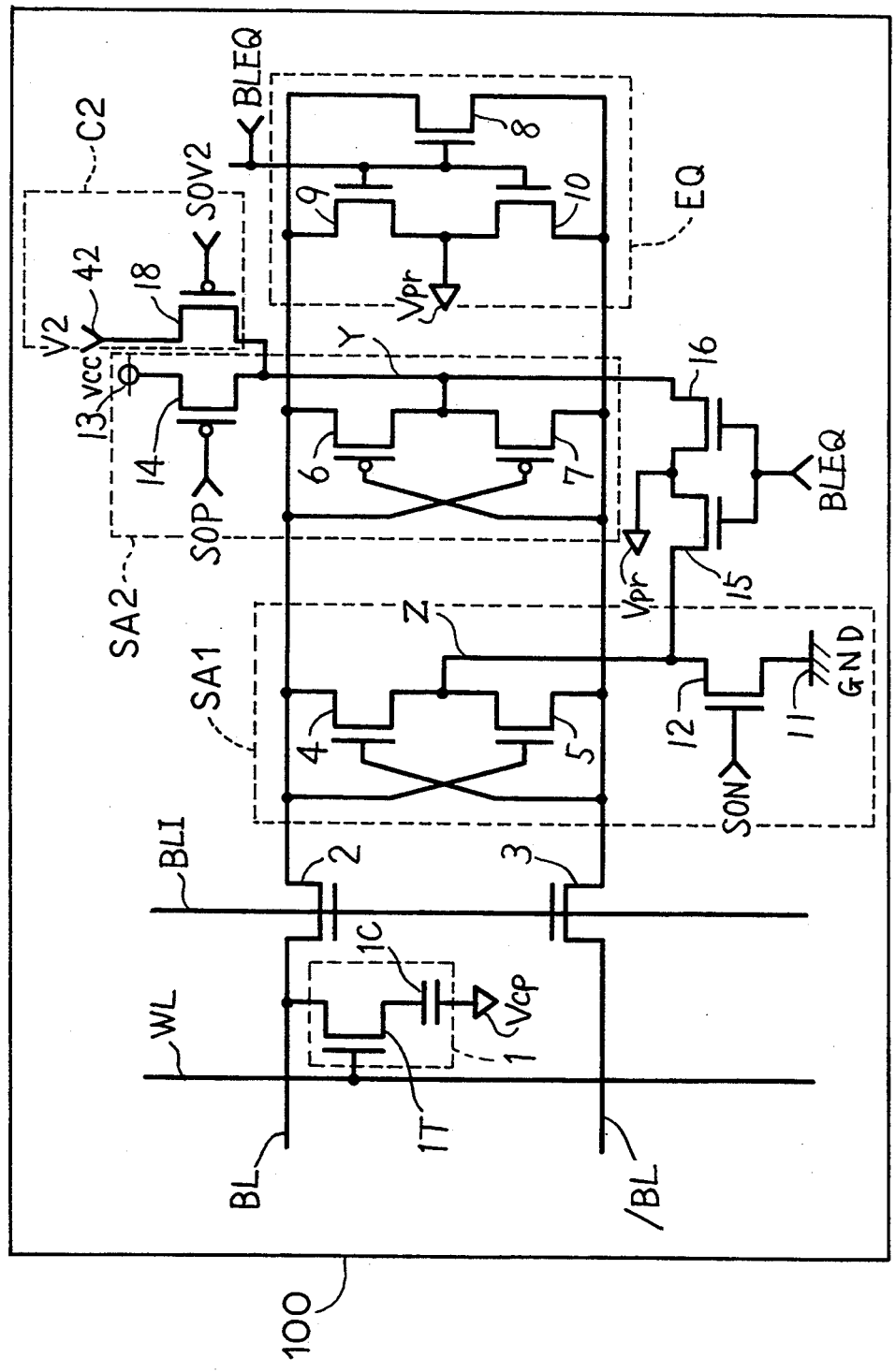
FIG. 6 is a circuit diagram showing a structure of a semiconductor memory device according to a second embodiment of the present invention.

The semiconductor memory device of FIG. 6 includes a potential control circuit C2. Potential control circuit C2 includes a potential node 42 and a PMOS transistor 18. PMOS transistor 18 is connected between potential node 42 receiving a potential V2 higher than power supply potential VCC, and supply line node Y. Control signal SOV2 is applied to the gate of PMOS transistor 18. PMOS transistor 18 serves to alter the source potentials of PMOS transistors 6 and 7 to a level higher than power supply potential VCC. The semiconductor memory device of FIG. 6 has a structure similar to that of FIG. 15 except for the portion where PMOS transistor 18 is provided.

The semiconductor memory device of FIG. 6 has the principle of speeding the amplify operation of the first sense amplifier SA1 carried out in the semiconductor memory device of the first embodiment applied to a second sense amplifier SA2.

The operation of the semiconductor memory device of FIG. 6 will be described hereinafter. The operation of second sense amplifier SA2 is initiated after the operation of first sense amplifier SA1 has started. At the start of the operation of second sense amplifier SA2, control signal SOV2 is activated to attain a low level, whereby PMOS transistor 18 is activated. Activation of PMOS transistor 18 causes short circuit between supply line node Y and potential node 42, whereby the potential of supply line node Y is raised towards second potential V2. As a result, PMOS transistors 6 and 7 have their gate-source voltages increased to be activated.

When PMOS transistors 6 and 7 are activated, the on resistance of PMOS transistor 6 is lower than the on resistance of PMOS transistor 7 due to the potential of bit line BL being higher than the potential of bit line /BL, whereby the potential of bit line BL is increased. Here, the gate-source voltages of PMOS transistors 6 and 7 are so high that the potential of bit line BL can be increased at high speed.

When a predetermined time period elapses, control signal SOV2 is inactivated to cause PMOS transistor 18 to attain an inactivate state. Then, sense operation activating signal SOP is activated to attain a low level, whereby PMOS transistor 14 is activated. Activation of PMOS transistor 14 causes short circuit between supply line node Y and power supply node 13, whereby the potential of supply line node Y is controlled so as to attain the level of power supply potential VCC.

According to the operation of the semiconductor memory device of the second embodiment, the potential of supply line node Y is controlled so as to attain a potential V2 higher than power supply potential VCC for a predetermined time period after the start of an amplify operation of second sense amplifier SA2. Therefore, the gate-source voltages of PMOS transistors 6 and 7 are increased at the start of an amplify operation to increase the operation margin thereof.

As a result, PMOS transistors 6 and 7 will have a great original operation margin to allow reliable operation and high speed differential amplify operation even when the precharge potential is lowered due to reduction of power supply potential and when threshold voltages of PMOS transistors 6 and 7 are increased due to a body effect.

Third Embodiment

A semiconductor memory device according to a third embodiment of the present invention will be described hereinafter with reference to FIG. 7. Because the basic structure of the semiconductor memory device of FIG. 7 is similar to that of FIG. 15, corresponding elements have the same reference characters denoted, and their description will not be repeated.

Figure 7:
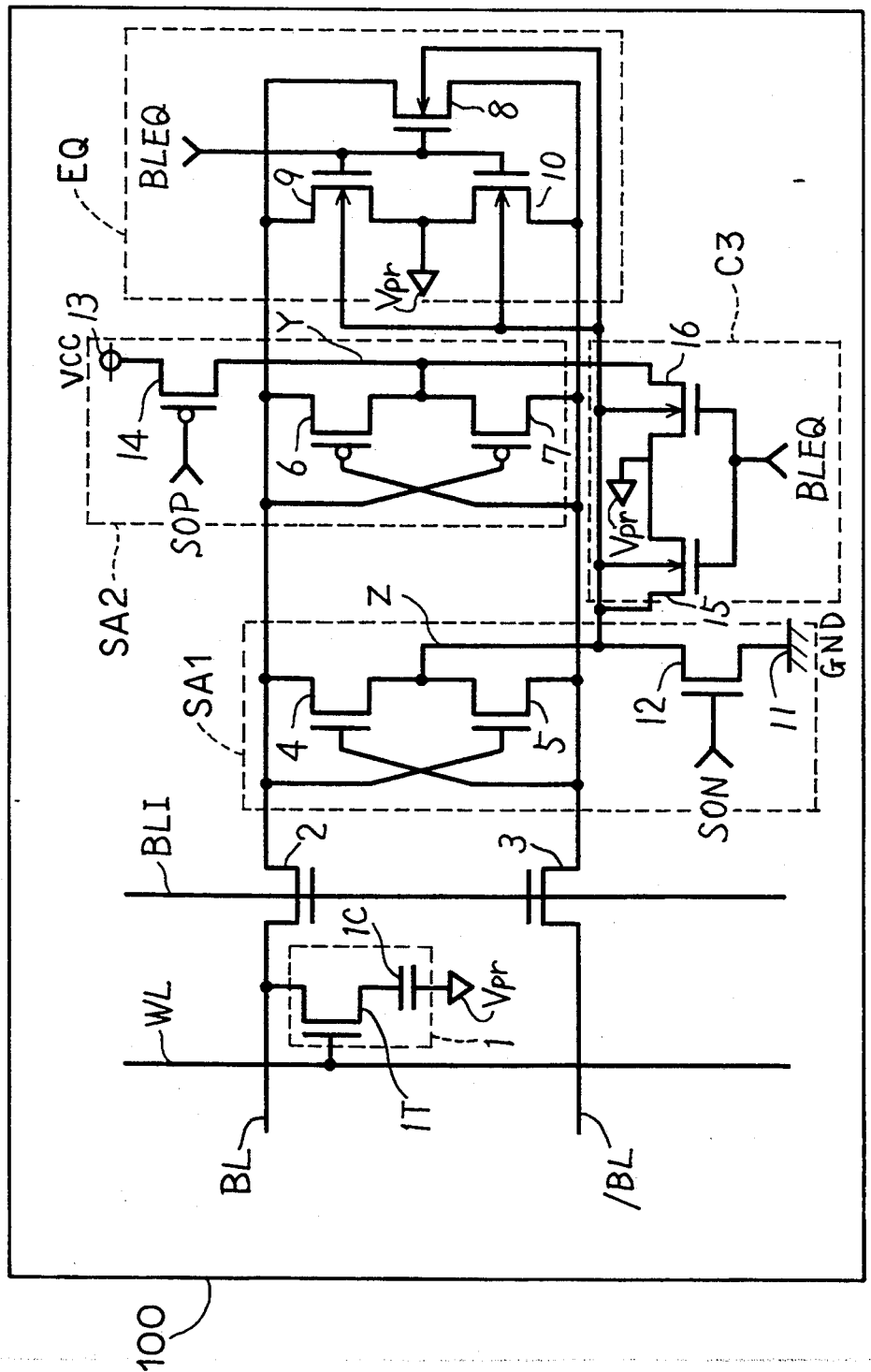
FIG. 7 is a circuit diagram showing a structure of a semiconductor memory device according to a third embodiment.

In the semiconductor memory device of FIG. 7, short circuit is established between the well in which NMOS transistors 8, 9 and 10 forming an equalizer EQ and NMOS transistors 15 and 16 are provided, and an outgoing line node Z of first sense amplifier SA1. A potential control circuit C3 is formed of NMOS transistors 15 and 16 and potential node Vpr. The structure of the other elements is similar to that of FIG. 15.

Figure 8:
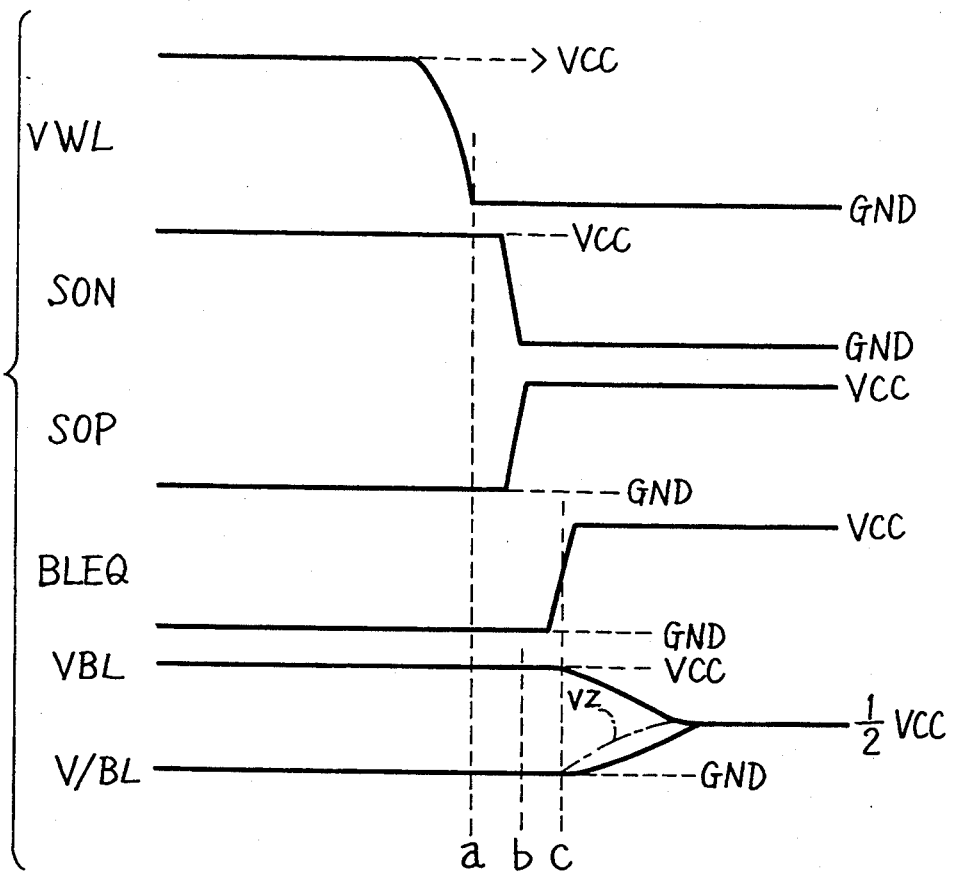
FIG. 8 is a signal waveform diagram of each component in circuitry in a precharge operation in the semiconductor memory device of the third embodiment.

The operation of the semiconductor memory device of FIG. 7 will be described hereinafter with reference to FIG. 8.

At time a, word line WL is activated to attain a low level. At time b, sense operation activating signals SON and SOP are both inactivated, whereby sense operation activating signals SON and SOP attain a low level and a high level, respectively. As a result, the amplify operation of first and second sense amplifiers SA1 and SA2 is ceased at time b.

Then, a precharge operation is initiated. A precharge operation starts by a precharge activating signal BLEQ being activated at time c.

The activation of precharge activating signal BLEQ attaining a high level causes activation of NMOS transistors 8, 9, 10, 15 and 16. The activation of NMOS transistors 15 and 16 causes outgoing line node Z and supply line node Y to be precharged to $\frac{1}{2}$ VCC by the supply from potential node Vpr. Furthermore, the activation of NMOS transistors 8, 9 and 10 causes short circuit between the pair of bit lines BL and /BL by NMOS transistor 8, short circuit between bit line BL and potential node Vpr by NMOS transistor 9, and short circuit between bit line /BL and potential node Vpr by NMOS transistor 10.

Under such a state, potential VBL of bit line BL is higher than the potential of potential node Vpr ($\frac{1}{2}$ VCC). Therefore, the potential of bit line BL is reduced towards $\frac{1}{2}$ VCC. Conversely, potential V/BL of bit line /BL is lower than the potential of potential node Vpr, whereby potential of bit line /BL is increased towards $\frac{1}{2}$ VCC.

In the above-described precharge operation, the source potential of each of NMOS transistors 8, 9, 10, 15 and 16 increases as precharging is carried out. Potential VZ of outgoing line node Z is increased towards $\frac{1}{2}$ VCC, and respective wells of NMOS transistors 8, 9, 10, 15 and 16 increases according to the increment of potential VZ of outgoing line node Z by the supply from outgoing line node Z.

Because the potential difference between the source potential and the substrate potential in the respective NMOS transistors of 8, 9, 10, 11 and 16 is maintained at a constant low amount during precharging, the body effect occurring in NMOS transistors 8, 9, 10, 15 and 16 are held at a low level.

As a result, NMOS transistors 8, 9, 10, 15, and 16 operate reliably to allow precharging at a high speed because the body effect therein is low.

The present invention is not limited to the third embodiment in which short circuit is established between the well of all the NMOS transistors and outgoing line node Z, and short circuit may be established only for a portion of the NMOS transistors. The potential of the well in which NMOS transistors for precharging is located does not have to be equal to the potential of outgoing line node Z. The potential of the well of these transistors may be a level that is not affected by a body effect on the transistors.

In the third embodiment, the NMOS transistor for precharging on a semiconductor substrate is provided on the same region where the transistor for forming a sense amplifier is provided, as shown in FIG. 3. The present invention is not limited to this arrangement, and an NMOS transistor for precharging may be provided in a region differing from that of the sense amplifier and isolated therefrom electrically. Furthermore, the potential of the well in which a MOS transistor for precharging is located may be identical to that of the well in which a MOS transistor forming a sense amplifier is located, provided that the potential thereof is a level that is not greatly influenced by a body effect on the NMOS transistor. The potential may be controlled by other potential control means.

Fourth Embodiment

A semiconductor memory device according to a fourth embodiment of the present invention will be described hereinafter with reference to FIG. 9. Because the structure of the basic portions such as first and second sense amplifiers SA1 and SA2 and equalizer EQ in the semiconductor memory device of FIG. 9 is similar to that of FIG. 15, corresponding elements have the same reference characters denoted, and their description will not be repeated.

Figure 9:
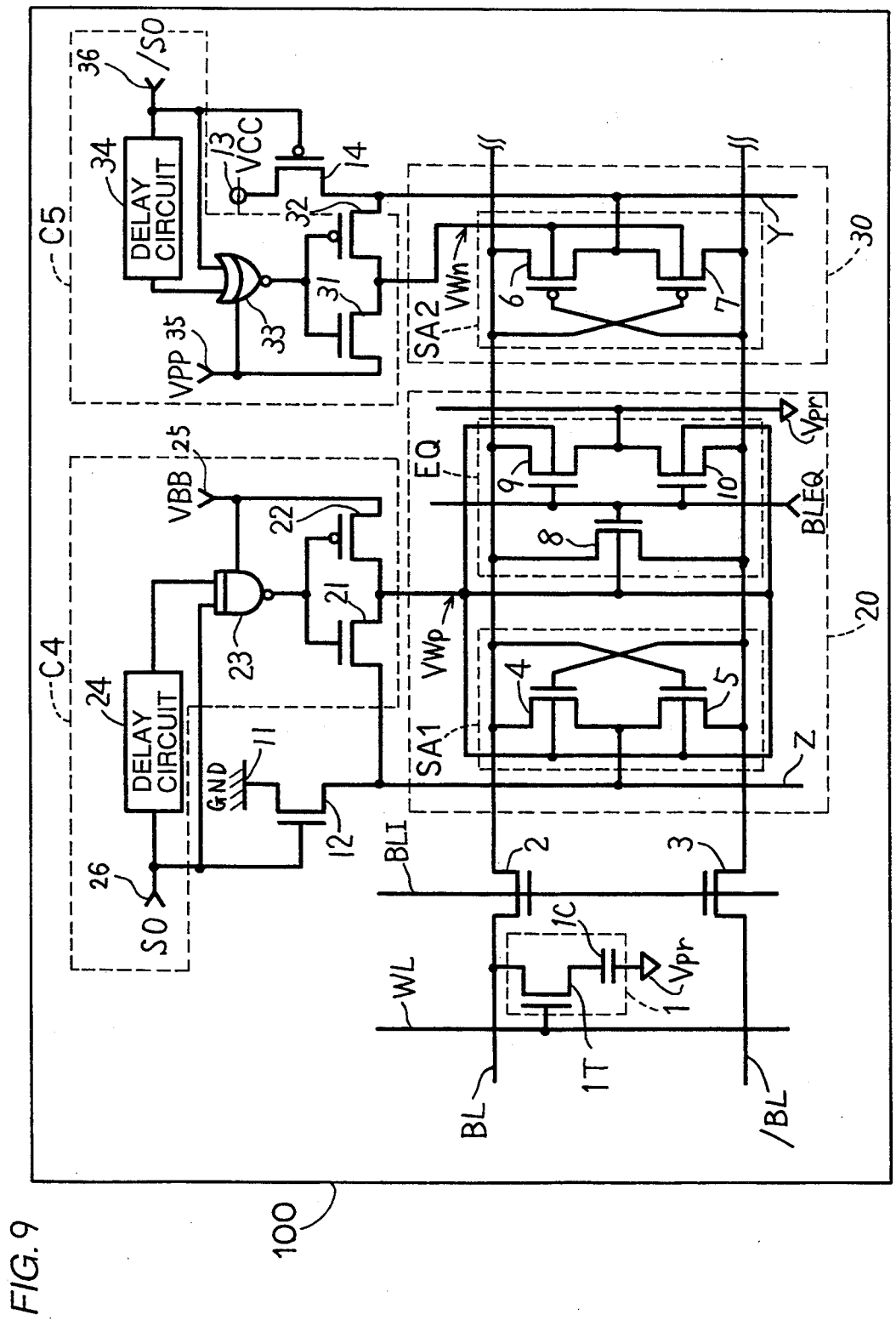
FIG. 9 is a circuit diagram showing a structure of a semiconductor memory device according to a fourth embodiment.

In the semiconductor memory device of FIG. 9, a first potential control circuit C4 for controlling the potential of a well region 20 in which first sense amplifier SA1 and equalizer EQ are provided, and a second potential control circuit C5 for controlling the potential of a well region 30 in which second sense amplifier SA2 is located are provided in addition to a conventional structure.

First potential control circuit C4 will be described hereinafter. First potential control circuit C4 includes NMOS transistors 12 and 21, a PMOS transistor 22, an NAND circuit 23, and a delay circuit 24. NMOS transistor 12 is connected between outgoing line node Z of NMOS transistors 4 and 5 and ground node 11 receiving ground potential GND. Potential node 25 receives a first potential VBB lower than ground potential GND. NMOS transistor 21 and PMOS transistor 22 are connected in series between outgoing line node Z and potential node 25.

Input node 26 receives sense operation activating signal SO. NAND circuit 23 is connected between an input node 26 and the respective gates of NMOS transistor 21 and PMOS transistor 22. Sense operation activating signal SO from input node 26 is directly applied to one input terminal of NAND circuit 23. Sense operation activating signal SO from node 26 is applied via delay circuit 24 to the other input terminal of NAND circuit 23. The output terminal of NAND circuit 23 is connected to the respective gates of NMOS transistor 21 and PMOS transistor 22. Sense operation activation signal SO is applied to the gate of NMOS transistor 12 from input node 26.

The structure of second potential control circuit C5 will be described hereinafter. Second potential control circuit C5 includes an NMOS transistor 31, PMOS transistors 14 and 32, an NOR circuit 33 and a delay circuit 34. PMOS transistor 14 is connected between outgoing line node Y of PMOS transistors 6 and 7 and potential node 13 receiving power supply potential VCC. Potential node 35 receives a second potential VPP higher than power supply potential VCC. PMOS transistor 32 and NMOS transistor 31 are connected in series between supply line node Y and potential node 35.

Input node 36 receives sense operation activating signal /SO. NOR circuit 33 is connected between input node 36 and the respective gates of PMOS transistor 32 and NMOS transistor 31. Sense operation activating signal /SO from input node 36 is directly applied to one input terminal of NOR circuit 33. Sense operation activating signal /SO from input node 36 is applied via delay circuit 34 to the other input terminal of NOR circuit 33. NOR circuit 33 has its output terminal connected to the respective gates of PMOS transistor 32 and NMOS transistor 31. Sense operation activating signal /SO is applied from input node 36 to the gate of PMOS transistor 14.

The node between NMOS transistor 21 and PMOS transistor 22 establishes short-circuit with the well of well region 20 in which first sense amplifier SA1 and equalizer EQ are provided. The node between, PMOS transistor 32 and NMOS transistor 31 establishes short-circuit with the well of well region 30 in which second sense amplifier SA2 is provided.

The structure of the other elements in the semiconductor memory device of FIG. 9 is similar to that of FIG. 15.

The operation of the semiconductor memory device of FIG. 9 will be described with reference to the signal waveform diagram of FIG. 10.

In a period of A prior to the amplify operation of first and second sense amplifiers SA1 and SA2, potentials VBL and V/BL of bit line pair BL and /BL, potential VZ of outgoing line node Z, potential VY of supply line node Y, well potential VWp of well region 20, and well potential VWn of well region 30 are respectively precharged to ½ VCC.

In period B following period A, the amplify operation of first sense amplifier SA1 and the amplify operation of second sense amplifier SA2 start at the same time. An amplify operation is carried out as set forth in the following. In first potential control circuit C4, sense operation activating signal SO is activated to attain a high level. As a result, NMOS transistor 12 is rendered active. Furthermore, in NAND circuit 23, the signal from signal node 26 attains a high level and the signal from delay circuit 24 attains a low level to provide an output signal of high level, whereby NMOS transistor 21 is activated.

This causes short circuit between outgoing line node Z and ground node 11, and between the well of well region 20 and ground node 11, whereby potential VZ of outgoing node Z and well potential VWp are both reduced towards ground potential GND.

In second potential control circuit C5, sense operation activating signal /SO is activated to attain a low level. As a result, PMOS transistor 14 is activated. In NOR circuit 33, the signal from signal node 36 attains a low level and the signal from delay circuit 34 attains a high level to provide an output signal of a low level, whereby PMOS transistor 32 is activated.

This causes short circuit between supply line node Y and power supply node 13 and between the well of well region 30 and power supply node 13, whereby potential VY of supply line node Y and well potential VWn are both increased towards power supply potential VCC.

In a period of C following period B, potential VBL of bit line BL attains the level of power supply potential VCC, and potential V/BL of bit line /BL attains the level of ground potential GND.

In period D following period C, delay term TD of delay circuits 24 and 34 elapses at the beginning thereof, whereby the signal applied to NAND circuit 23 from delay circuit 24 and the signal applied to NOR circuit 33 from delay circuit 34 attain a high level and a low level, respectively.

Under such a state, the output of NAND circuit 23 attains a low level in first potential control circuit C4, whereby NMOS transistor 21 and PMOS transistor 22 are inactivated and activated, respectively. This causes short circuit between the well of well region 20 and potential node 25, whereby well potential VWp is reduced to a level where threshold voltage Vth(p) of PMOS transistor 22 is added to first potential VBB [VBB+Vth(p)].

In second potential control circuit C5, the output signal of NOR circuit 33 attains a high level, whereby PMOS transistor 32 and NMOS transistor 31 are inactivated and activated, respectively. This causes short circuit between the well of well region 30 and potential node 35, whereby well potential VWn is increased to a level where threshold voltage Vth(n) of NMOS transistor 31 is subtracted from second potential VPP [VPP−Vth(n)].

As described above, well potential VWp is controlled so as to attain a level of potential VBB which is lower than ground potential GND, and well potential VWn is controlled so as to attain a potential VPP higher than power supply potential VCC during period D. By such potential control, body effect occurs on each NMOS transistor forming first sense amplifier SA1 and equalizer EQ, and also on each PMOS transistor forming second sense amplifier SA2, whereby all MOS transistors are increased in threshold.

As a result, the leak current in each MOS transistor is reduced, and potentials VBL and V/BL of bit lines BL and /BL are stabilized that are amplified to predetermined potentials by first and second sense amplifiers. SA1 and SA2.

In the next period of E, sense operation activating signals SO and /SO are inactivated and precharge activating signal BLEQ is activated, whereby the amplify operations of first and second sense amplifiers SA1 and SA2 are ceased and a precharge operation by equalizer EQ is initiated.

In a semiconductor memory device according to a fourth embodiment of the present invention, the potentials of the pair of bit lines BL and /BL are set to a predetermined potential by amplification of first and second sense amplifiers SA1 and SA2, and then the well potential of first sense amplifier SA1 and equalizer EQ, and the well potential of second sense amplifier SA2 are controlled, whereby a body effect occurs on the MOS transistors forming first sense amplifier SA1 and equalizer EQ and the MOS transistor forming second sense amplifier SA2 to suppress leak current of these MOS transistor.

Even if the power supply potential is reduced and the threshold voltage of each MOS transistor is lowered, leak current in each MOS transistor is suppressed by the body effect in the semiconductor memory device of the fourth embodiment, so that the potentials of a pair of bit lines after amplification can be stabilized. The potential of a well in which a transistor is positioned can be controlled so as to attain an arbitrary level over time. Furthermore, the potential of a well in which a transistor is positioned can be fixed at an arbitrary level or state for an arbitrary time period during said elapse of time.

Fifth Embodiment

Figure 11:
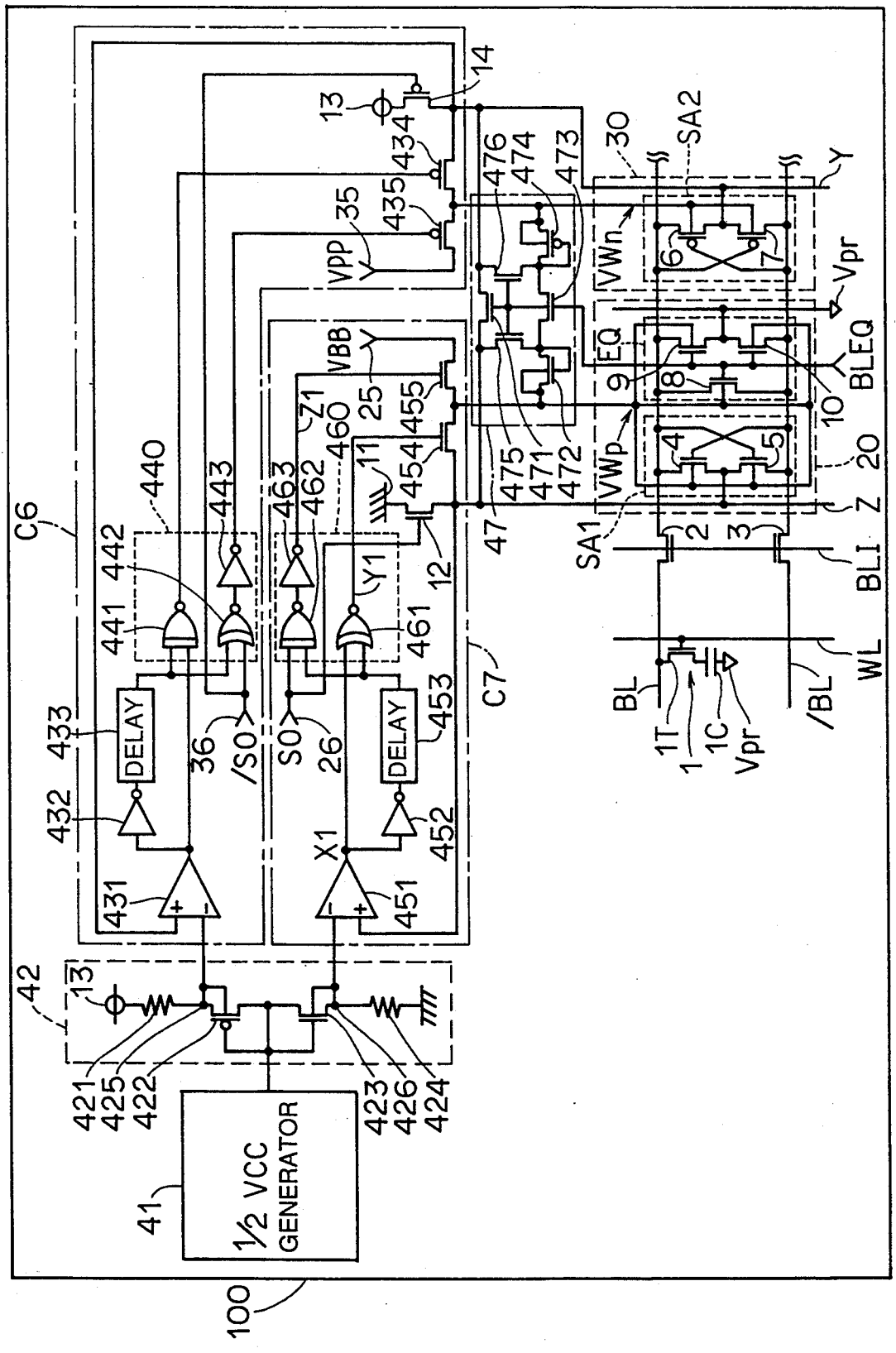
FIG. 11 is a circuit diagram showing a structure of a semiconductor memory device according to a fifth embodiment.

A semiconductor memory device according to a fifth embodiment of the present invention will be described hereinafter with reference to FIG. 11 which is a circuit diagram showing a structure thereof. The semiconductor memory device of FIG. 11 differs from that of FIG. 9 by the structure of the control system of well potentials VWp and VWn. The well potential control system includes a ½ VCC generation circuit 41, a reference potential generation circuit 42, a potential control circuit C6, a potential control circuit C7 and an equalize circuit 47.

½ VCC generation circuit 41 generates a potential of ½ VCC. In reference potential generation circuit 42, a resistor 421, a PMOS transistor 422, an NMOS transistor 423, and a resistor 424 are connected in series between power supply node 13 and ground node 11.

Respective gates of PMOS transistor 422 and NMOS transistor 423, and the node between PMOS transistor 422 and NMOS transistor 423 receive a potential of ½ VCC respectively from ½ VCC generation circuit 41. In reference potential generation circuit 42, the potential of node 425 between resistor 421 and PMOS transistor 422 and the potential of node 426 between NMOS transistor 423 and resistor 424 are provided respectively as reference potentials. The reference potential provided from node 425 is higher than ½ VCC by the boost of PMOS transistor 422. The reference potential provided from node 426 is lower than ½ VCC by the drop of NMOS transistor 423.

Control circuit C6 includes a comparator 431, an inverter 432, a delay circuit 433, a level changing circuit 440, and PMOS transistors 13, 434 and 435. Level changing circuit 440 includes an NAND circuit 441, an NOR circuit 442, and an inverter 443.

PMOS transistors 434 and 435 are connected in series between supply line node Y and potential node 35. Comparator 431 receives the potential of supply line node Y at its positive input terminal and the potential of node 425 at its negative input terminal. The output signal of comparator 431 is provided to NAND circuit 441 directly and also via inverter 432 and delay circuit 433.

The output signal of NAND circuit 441 is provided to the gate of PMOS transistor 434. NOR circuit 442 is applied with an output signal of delay circuit 433 and a sense operation activating signal /SO. The output signal of NOR circuit 442 is provided to the gate of PMOS transistor 435 via inverter 443.

Control circuit C7 includes a comparator 451, an inverter 452, a delay circuit 453, a level changing circuit 460, and NMOS transistors 12, 454 and 455. Level changing circuit 460 includes an NOR circuit 461, an NAND circuit 462 and an inverter 463.

NMOS transistors 454 and 455 are connected in series between outgoing line node Z and potential node 25. Comparator 451 receives the potential of outgoing line node Z at its positive input terminal and the potential of node 426 at its negative input terminal. The output signal of comparator 451 is provided to NOR circuit 461 directly and also via inverter 452 and delay circuit 453.

The output signal of NOR circuit 461 is applied to the gate of NMOS transistor 454. NAND circuit 462 is applied with an output signal of delay circuit 453 and a sense operation activating signal SO. The output signal of NAND circuit 462 is applied to the gate of NMOS transistor 455 via inverter 463.

Equalize circuit 47 includes NMOS transistors 471, 472, 473, 475 and 476, and a PMOS transistor 474. Transistor 471 is connected between outgoing line node Z and supply line node Y.

Transistors 472, 473 and 473 are connected in series between the well of well region 20 and the well of well region 30. Transistor 475 is connected between the node of transistors 472 and 473 and outgoing line node Z. Transistor 476 is connected between the node of transistors 473 and 474 and supply line node Y.

The gates of transistors 471, 473, 475 and 476 receive precharge activating signal BLEQ. The gate of transistor 472 is connected to the node between transistors 472 and 473. In other words, transistor 472 is diode-connected. The gate of transistor 474 is connected to the node between transistors 473 and 474. In other words, transistor 474 is diode-connected.

Figure 12:
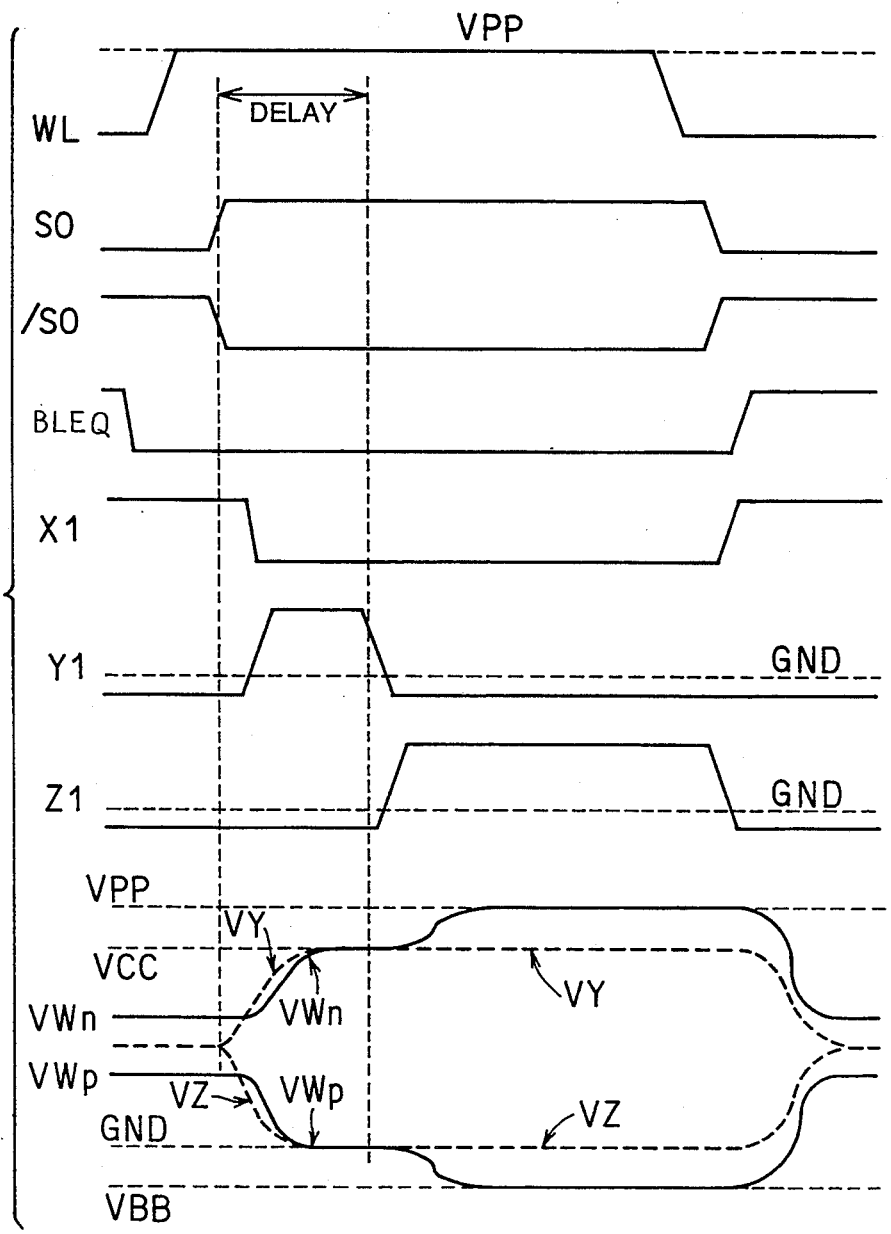
FIG. 12 is a signal waveform diagram showing each component in circuitry at the time of a data read out operation in the semiconductor memory device of the fifth embodiment.

The operation of the semiconductor memory of FIG. 11 will be described hereinafter. FIG. 12 is a signal waveform diagram of each components in circuitry in a readout operation. FIG. 12 corresponds to FIG. 10, and differs therefrom in the following points.

When precharge activating signal BLEQ attains a high level, NMOS transistors 471, 473, 475 and 476 are each turned on. This equalizes outgoing line node Z with supply line node Y, whereby respective potentials of outgoing line node Z and supply line node Y attain the level of ½ VCC. Also, the wells of well regions 20 and 30 are equalized.

Because transistors 475 and 476 are both turned on, the nodes between transistors 472 and 473 and between transistors 473 and 474 respectively attain the level of ½ VCC. Therefore, the well potential VWp becomes ½ VCC−Vth (p), where Vth (p) is the threshold voltage of transistor 472. Well potential VWn becomes ½ VCC+Vth (n) where Vth (n) is the threshold voltage of transistor 474.

According to the semiconductor memory device of the fifth embodiment, well potentials VWp and VWn are respectively offset from ½ VCC in a precharge state. This provides advantages as set forth in the following.

If well potentials VWp and VWn are respectively set to ½ VCC in a precharge state, the following disadvantage is encountered. When initial amplitude of potential occurs due to data readout in the pair of bit lines BL and /BL prior to the start of a sense operation by first and second sense amplifiers SA1 and SA2, the source or drain of the transistors forming first and second sense amplifiers SA1 and SA2 is slightly biased in the forward direction of well potentials VWp and VWn.

Such a bias causes a weak current flow from the source or drain connected to the bit line having an initial amplitude generation into the underlying well. This causes a slight change in the potential level of that bit lines. As a result, there is a disadvantage that the initial amplitude appearing on the bit line pair is slightly reduced.

The semiconductor memory device of the fifth embodiment has well potentials VWp and VWn controlled so as to attain a potential level offset from ½ Vcc. Therefore, the above-described weak forward bias is controlled to prevent the slight change in the initial amplitude of the bit line pair.

Figure 10:
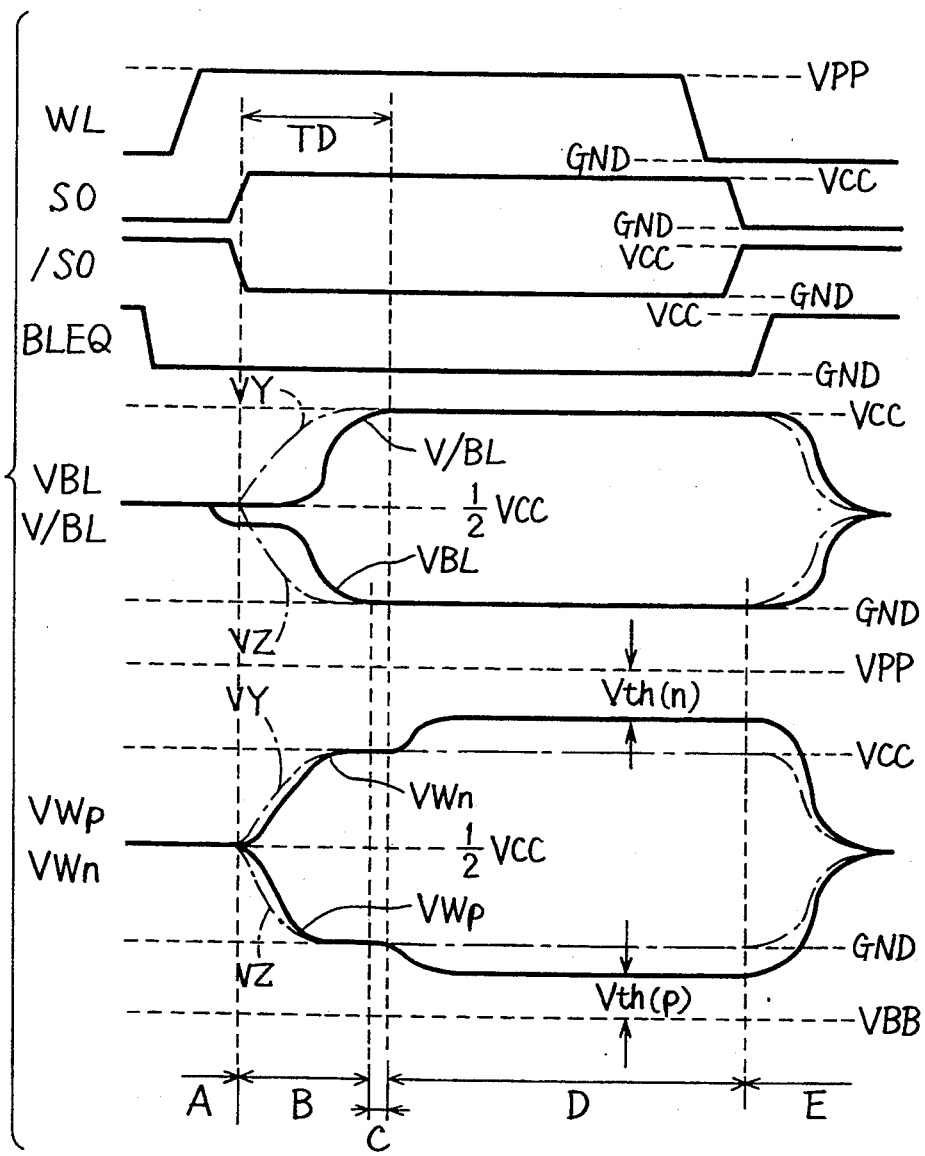
FIG. 10 is a signal waveform diagram showing each component in circuitry at the time of a data read out operation in the semiconductor memory device of the fourth embodiment.

FIG. 12 differs from FIG. 10 in the operation of controlling well potentials VWp and VWn at the time of a sense operation. Similar to the fourth embodiment, the semiconductor memory device of the fifth embodiment has well potentials VWp and VWn controlled to a potential higher than power supply potential VCC or a potential lower than ground potential GND, after the potentials of the bit line pair BL and /BL attaining the levels of power supply potential VCC or ground potential GND, respectively.

The operation of control circuits C6 and C7 will be described. The operation of control circuit C7 will be described as a typical example. Referring to FIG. 12, sense operation activating signal SO is activated to attain a low level. This turns PMOS transistor 12 ON, and the potential of outgoing line node Z is reduced towards ground potential GND.

Reduction in the potential of outgoing line node Z causes output signal X1 of comparator 451 to attain a low level. In response, output signal Y1 of NOR circuit 461 attains a high level. This turns on NMOS transistor 454, whereby well potential VWp is reduced towards ground potential GND.

Then, the output signal of delay circuit 453 attains a high level. In response, output signal Y1 of NOR circuit 461 attains a low level and output signal Z1 of inverter 463 attains a high level. This causes NMOS transistors 454 and 455 to be turned off and on, respectively. As a result, well potential VWp is controlled to a level further lower than ground potential GND.

When sense operation activating signal SO attains a low level and a sense operation ends, precharge activating signal BLEQ is activated to attain a high level. This operates equalize circuit 47, whereby potential VZ of outgoing line node Z and potential VY of supply line node Y are controlled to the level of ½ VCC. Well potentials VWp and VWn are controlled to potential levels offset from ½ VCC.

Sixth Embodiment

Figure 13:
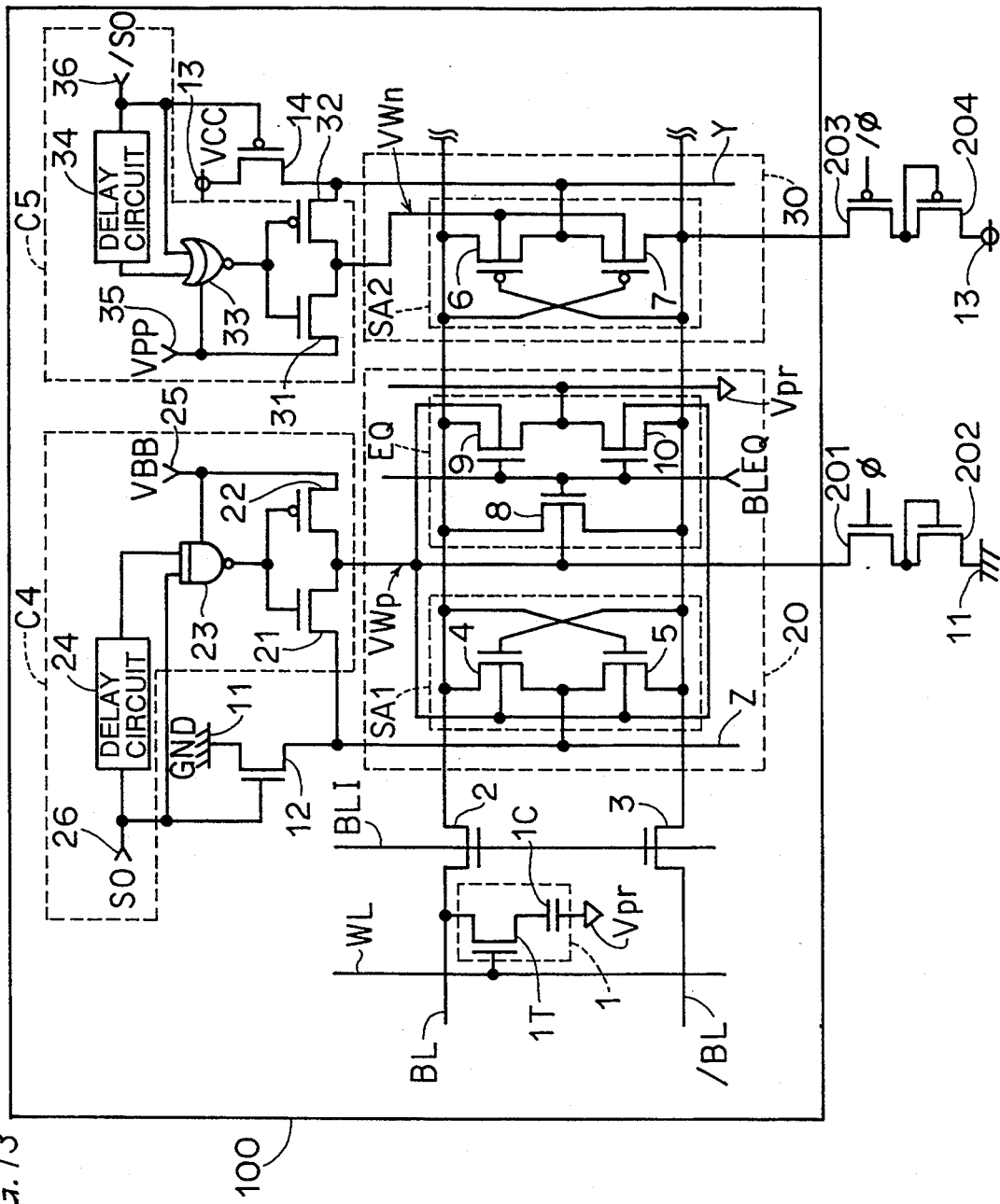
FIG. 13 is a circuit diagram showing a structure of a semiconductor memory device according to a sixth embodiment.

FIG. 13 is a circuit diagram showing a structure of a semiconductor memory device according to a sixth embodiment. The components in FIG. 13 corresponding to those in FIG. 9 have the same reference characters denoted, and their description will not be repeated.

The semiconductor memory device of FIG. 13 differs from that of FIG. 9 in the following points. NMOS transistors 201 and 202 are connected in series between the well of well region 20 and ground node 11. Also, PMOS transistors 203 and 204 are connected in series between power supply node 13 and well region 30.

NMOS transistor 202 and PMOS transistor 204 are respectively diode-connected. NMOS transistor 201 and PMOS transistor 205 receive control signals $\phi$ and $/\phi$, respectively.

Figure 14:
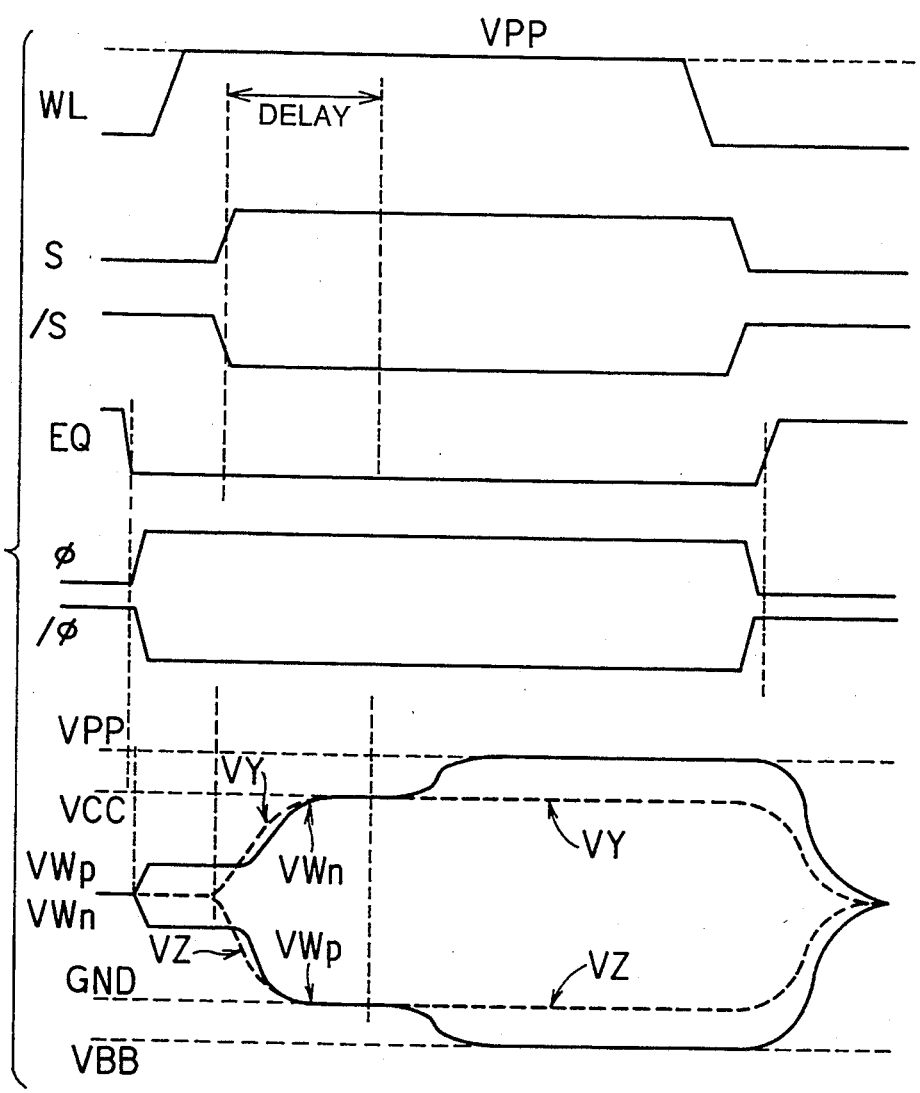
FIG. 14 is a signal waveform diagram showing each component in circuitry at the time of a data read out operation in the semiconductor memory device of the sixth embodiment.

The operation of the semiconductor memory device of FIG. 13 will be described hereinafter. FIG. 14 is a signal waveform diagram of each component in circuitry at the time of data readout. FIG. 14 corresponds to FIG. 10, and differs therefrom in the points set forth in the following.

After well potentials VWn and VWp are controlled so as to attain ½ VCC, control signal $\phi$ attains a high level and control signal $/\phi$ attains a low level at a predetermined timing.

In response, NMOS transistor 201 and PMOS transistor 203 are both turned on. This causes well potential VWp to be reduced to the potential level of ½ VCC$-\alpha$ defined by ground potential GND and NMOS transistor 202. Well potential VWn is increased to the potential level of ½ VCC$+\beta$ defined by power supply potential VCC and PMOS transistor 204.

Thus, well potential VWp is controlled so as to attain a level lower than ½ VCC and well potential VWn is controlled so as to attain a level higher than ½ VCC until a sense operation of first and second sense amplifiers are initiated.

Therefore, the semiconductor memory device of the sixth embodiment attains an effect similar to that of the semiconductor memory device of the sixth embodiment. The semiconductor memory device of the sixth embodiment has a further advantage of the precharge operation by equalizer EQ being carried out faster than that of the fifth embodiment.

This will be described in detail hereinafter. In the fifth embodiment, a backgate bias effect is imposed on each transistor forming equalizer EQ because well potentials VWp and VWn are controlled so as to attain a level offset from ½ VCC after a sense operation. This will increase the threshold voltage of each transistor to reduce the speed of a precharge operation. In the sixth embodiment, potentials VWp and VWn are controlled so as to first attain the level of ½ VCC when a sense operation is completed. The aforementioned backgate bias effect is not imposed, so that a precharge operation can be carried out at a high speed.

Thus, according to the present invention, a sense amplifier can operate stably and sufficiently even when power supply voltage is reduced.

Also, an equalizer can operate stably and sufficiently even when power supply voltage is reduced.

Furthermore, leak current of an MOS transistor forming a sense amplifier can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a semiconductor substrate, comprising:
   a memory cell storing charge representing data,
   a pair of bit lines connected to said memory cell, and from which a potential difference is generated therebetween according to said charge,
   precharge means including an MOS transistor connected between said pair of bit lines for precharging said pair of bit lines to a predetermined precharge potential prior to generation of a potential difference according to said charge by operation of said MOS transistor,
   differential amplify means including a pair of MOS transistors connected in series between said pair of bit lines for differential-amplifying the potential difference between said pair of bit lines by bringing the potentials of the sources of said pair of MOS transistors to said precharge potential in said precharging and then changing the potentials therefrom,
   potential control means for controlling the substrate potential of the MOS transistor of said precharge means so as to commensurate with change in the potentials of sources of said pair of MOS transistors of said differential amplify means.

2. The semiconductor memory device according to claim 1, wherein said potential control means comprises
a node for receiving a precharge potential, and
a first transistor having a gate receiving a control signal, and responsive to said control signal for applying said precharge potential to the sources of said pair of MOS transistors of said differential amplify means and a region of said semiconductor substrate in which said MOS transistor of said precharge means is provided.

3. The semiconductor memory device according to claim 1, wherein said precharge means comprises
a second transistor having a gate receiving a control signal, and connected between said pair of bit lines for equalizing said pair of bit line in response to said control signal,
a node for receiving a precharge potential,
a third transistor having a gate receiving a control signal and connected between one of said pair of bit lines and said node for applying a precharge potential to said one bit line in response to said control signal, and
a fourth transistor having a gate for receiving a control signal, and provided between the other of said pair of bit lines and said node for applying a precharge potential to said other bit line in response to said control signal.

4. The semiconductor memory device according to claim 1, further comprising:
a first well region formed on said semiconductor substrate and electrically isolated from other regions, and
a second well region formed on said semiconductor substrate and electrically isolated from other regions,
wherein said memory cell is formed in said first well region, and said pair of MOS transistors of said differential amplify means and said MOS transistor of said precharge means are formed in said second well region.

5. A method of operating a semiconductor memory device including precharge means having a MOS transistor connected between a pair of bit lines for precharging said pair of bit lines to a predetermined precharge potential before a potential difference is generated between said pair of bit lines by an operation of said MOS transistor, and differential amplify means having a pair of MOS transistors connected in series between said pair of bit lines for differential-amplifying the potential difference between said pair of bit lines by bringing the potentials of the sources of said pair of MOS transistors to said precharge potential in said precharging, and then changing the potentials therefrom, said method comprising the step of:
controlling the substrate potential of said MOS transistor of said precharge means so as to commensurate with change in the potentials of sources of said pair of MOS transistors of said differential amplify means.

* * * * *

UNITED STATES PATENT AND TRADEMARK OFFICE
CERTIFICATE OF CORRECTION

PATENT NO. : 5,412,605
DATED : May 2, 1995
INVENTOR(S) : Lloyd E. Jordan II, Shaw-Ben Shi, Martin J. Sirkin and Paul E. Stephens It is certified that error appears in the above-indentified patent and that said Letters Patent is hereby corrected as shown below:

Col. 6, line 8, please delete "G";

Cols. 5 and 6, before "CLIENT CODE" insert the following title:
--"C" SOURCE CODE IN ACCORDANCE WITH THE SUBJECT INVENTION--;

Col. 95, line 19, after "structures" insert -- --.

Signed and Sealed this

Sixteenth Day of July, 1996

Attest:

BRUCE LEHMAN

Attesting Officer  Commissioner of Patents and Trademarks